US012707746B2

(12) United States Patent
Kim et al.

(10) Patent No.: US 12,707,746 B2
(45) Date of Patent: Aug. 11, 2026

(54) IMAGE SENSOR AND METHOD OF FABRICATING THE SAME

(71) Applicant: Samsung Electronics Co., Ltd., Suwon-si (KR)

(72) Inventors: Kook Tae Kim, Suwon-si (KR); Jingyun Kim, Suwon-si (KR); Byeongtaek Bae, Suwon-si (KR); Seunghwi Yoo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 453 days.

(21) Appl. No.: 18/183,583

(22) Filed: Mar. 14, 2023

(65) Prior Publication Data

US 2024/0030263 A1 Jan. 25, 2024

(30) Foreign Application Priority Data

Jul. 21, 2022 (KR) ........................ 10-2022-0090591

(51) Int. Cl.
*H10F 39/00* (2025.01)
*H10F 39/12* (2025.01)

(52) U.S. Cl.
CPC ......... *H10F 39/807* (2025.01); *H10F 39/011* (2025.01); *H10F 39/199* (2025.01); *H10F 39/8053* (2025.01); *H10F 39/8057* (2025.01); *H10F 39/813* (2025.01)

(58) Field of Classification Search
CPC ............................ H10F 39/807; H10F 39/199
See application file for complete search history.

(56) References Cited

U.S. PATENT DOCUMENTS 7,239,003 B2 7/2007 Mouli et al.
8,399,956 B2 3/2013 Maynollo
8,445,950 B2 5/2013 Iida et al.
9,620,548 B1 4/2017 Wang et al.
10,043,841 B1 * 8/2018 Chang .................. H10F 39/807
10,163,647 B2 12/2018 Tsai et al.
10,622,395 B2 * 4/2020 Park ........................ H10F 39/18
10,784,301 B2 * 9/2020 Hong ................ H10F 39/80373
(Continued)

FOREIGN PATENT DOCUMENTS

KR 2010-0074497 A 7/2010
KR 2020-0087544 A 7/2020
(Continued)

*Primary Examiner* — Mounir S Amer
*Assistant Examiner* — Alexander Belousov
(74) *Attorney, Agent, or Firm* — Fish & Richardson P.C.

(57) ABSTRACT

An image sensor comprises a substrate having first and second surfaces opposite to each other, a fixed charge layer in contact with the second surface, an interlayer dielectric layer covering the first surface, a device isolation part adjacent to the first surface in the substrate, and a pixel isolation part in the substrate. The pixel isolation part includes a conductive pattern, a buried dielectric pattern, and an isolation dielectric pattern that is simultaneously in contact with the fixed charge layer and the interlayer dielectric layer. The isolation dielectric layer has a first thickness at a level between the buried dielectric pattern and the conductive pattern. The isolation dielectric layer has a second thickness at a level of a bottom surface of the fixed charge layer. The second thickness is different from the first thickness.

20 Claims, 24 Drawing Sheets

(56) References Cited

U.S. PATENT DOCUMENTS 11,031,434 B2 6/2021 Tsao et al.
11,121,163 B2 * 9/2021 Kim .................... H10F 39/807
11,152,415 B2 * 10/2021 Lim .................... H10F 39/8057
11,233,080 B2 1/2022 Liu et al.
11,239,269 B2 * 2/2022 Kim .................... H10F 39/014
11,257,857 B2 * 2/2022 Hur .................... H10F 39/802
11,348,960 B2 * 5/2022 Ha .................... H10F 39/811
11,652,113 B2 * 5/2023 Kim .................... H10F 39/014
257/432
11,837,621 B2 * 12/2023 Kim .................... H10F 39/014
11,843,016 B2 * 12/2023 Kim .................... H10F 39/807
11,948,956 B2 * 4/2024 Hong .................... H10F 39/80373
12,068,337 B2 * 8/2024 Kim .................... H10F 39/014
12,094,907 B2 * 9/2024 Kim .................... H10F 39/807
12,211,880 B2 * 1/2025 Kim .................... H10F 39/811
12,272,705 B2 * 4/2025 Kim .................... H10F 39/807
12,302,660 B2 * 5/2025 Noh .................... H10F 39/014
12,302,661 B2 * 5/2025 Noh .................... H10F 39/8067
12,408,453 B2 * 9/2025 Kim .................... H10F 39/014
12,457,818 B2 * 10/2025 Khang .................... H10F 39/807
12,543,396 B2 * 2/2026 Kim .................... H10F 39/807
2016/0225813 A1 * 8/2016 Liao .................... H10F 39/199
2017/0250211 A1 8/2017 Chang et al.
2020/0111821 A1 * 4/2020 Hong .................... H10F 39/80373
2020/0127025 A1 * 4/2020 Lim .................... H04N 25/79
2020/0144316 A1 * 5/2020 Kim .................... H10F 39/014
2020/0219911 A1 * 7/2020 Hur .................... H10F 39/802
2020/0219912 A1 * 7/2020 Ro .................... H10F 39/811
2020/0279877 A1 * 9/2020 Kim .................... H10F 39/807
2020/0381464 A1 * 12/2020 Hong .................... H10F 39/80373
2021/0111202 A1 * 4/2021 Ha .................... H10F 39/8037
2021/0151479 A1 5/2021 Tsai et al.
2021/0366954 A1 11/2021 Chen et al.
2021/0375964 A1 * 12/2021 Kim .................... H10F 39/807
2022/0013566 A1 * 1/2022 Kim .................... H10F 39/807
2022/0059581 A1 2/2022 Cheng et al.
2022/0059585 A1 * 2/2022 Kim .................... H10F 39/014
2022/0077204 A1 3/2022 Lee et al.
2022/0102405 A1 * 3/2022 Kim .................... H10F 39/80377
2022/0262829 A1 * 8/2022 Ha .................... H10F 39/014
2023/0131769 A1 * 4/2023 Kim .................... H10F 39/011
257/446
2023/0170372 A1 * 6/2023 Noh .................... H10F 39/811
257/432
2023/0170373 A1 * 6/2023 Noh .................... H10F 39/199
257/432
2023/0215892 A1 * 7/2023 Kim .................... H10F 39/18
257/432
2023/0253430 A1 * 8/2023 Kim .................... H10F 39/807
257/291
2023/0275104 A1 * 8/2023 Kim .................... H10F 39/014
257/432
2024/0030263 A1 * 1/2024 Kim .................... H10F 39/80373
2024/0072089 A1 * 2/2024 Kim .................... H10F 39/8053
2024/0079433 A1 * 3/2024 Kim .................... H10F 39/807
2024/0079436 A1 * 3/2024 Kim .................... H10F 39/811
2024/0145513 A1 * 5/2024 Kim .................... H10F 39/811
2024/0170521 A1 * 5/2024 Kim .................... H10F 39/026
2024/0204025 A1 * 6/2024 Bae .................... H10F 39/011
2024/0222408 A1 * 7/2024 Noh .................... H10F 39/014
2024/0266376 A1 * 8/2024 Noh .................... H10F 39/199
2024/0321910 A1 * 9/2024 Kim .................... H10F 39/014
2024/0363662 A1 * 10/2024 Kim .................... H10F 39/199
2025/0126916 A1 * 4/2025 Kim .................... H10F 39/807
2025/0248149 A1 * 7/2025 Kim .................... H10F 39/80377
2025/0255025 A1 * 8/2025 Kim .................... H10F 39/807
2025/0311461 A1 * 10/2025 Yoo .................... H10F 39/8053
2025/0374691 A1 * 12/2025 Kim .................... H10F 39/014
2025/0380524 A1 * 12/2025 Kim .................... H10F 39/8053
2026/0026123 A1 * 1/2026 Lee .................... H10F 39/199

FOREIGN PATENT DOCUMENTS

KR 2021-0088537 A 7/2021
KR 2022-0008996 A 1/2022

* cited by examiner

500
A'
A
EG
APS
FD
ACT
UP(2) UP(3)
SF UP(1) SEL
W1
W2
W3
RG
STI
UP(4)
1a
TG
DTI
14(1)
16(1)
X
Y
Z 500
48g
52
54
46
BCA
A'
A
EG
APS
W9
UP(1)
UP(2)
UP(3)
UP(4)
W6
W4
UP_E
UP_C
W8
W5
W7
1b
XP
CP
VP
16(2)
14(2)
DTI
X
Y
Z

FIG. 5

501
EG
APS
UP(1)
UP(2)
UP(3)
UP(4)
FD
PD
W1
W2
W3
TG
1a
GP
DTI
14(1)
16(1)
X
Y
Z

FIG. 8A

T1 1a 1b A' EG UP APS UP A 11 14L 7 3 5 22 1 X Z

FIG. 8B 1a
1b
A'
EG
UP
UP
APS
A
25L
16L
14L
7
3
5
22
1
X
Z

503
THY
ML
ML
CF1
CF2
PD
PD
GR
FD
Gox
UP
UP
APS
A
A'
50a
48a
26
1b
41
39
DTI
37
1
33
STI
1a
TG
15
IL
Z
X 504
73
150
221
200
223
400
PAD
TR6
TR5
83
135
133
131
130
71
125
123
121
120
OB
TR4
TR3
81
1a
136
90
PD"
PD'
APS
50a
1b
CF1
ML
PD
UP
1
DTI
STI

IMAGE SENSOR AND METHOD OF FABRICATING THE SAME

CROSS-REFERENCE TO RELATED APPLICATION

This U.S. nonprovisional application claims priority under 35 U.S.C § 119 to Korean Patent Application No. 10-2022-0090591 filed on Jul. 21, 2022 in the Korean Intellectual Property Office, the disclosure of which is hereby incorporated by reference in its entirety.

BACKGROUND

The present inventive concepts relate to image sensors and methods of fabricating the same.

An image sensor is a semiconductor device to transforms optical images into electrical signals. The image sensor may be classified into a charge coupled device (CCD) type and a complementary metal oxide semiconductor (CMOS) type. The CIS (CMOS image sensor) is a short for the CMOS type image sensor. The CIS may include a plurality of two-dimensionally arranged pixels. Each of the pixels includes a photodiode (PD). The photodiode serves to transform an incident light into an electrical signal.

SUMMARY

Some example embodiments of the present inventive concepts provide an image sensor capable of achieving sharp images.

Some example embodiments of the present inventive concepts provide a method of fabricating an image sensor capable of increasing a yield.

The objects of the present inventive concepts are not limited to the inventive concepts mentioned above, and other objects which have not been mentioned above will be clearly understood to those skilled in the art from the following description.

According to some example embodiments of the present inventive concepts, an image sensor may comprise: a substrate that has a first surface and a second surface opposite to the first surface; a fixed charge layer in contact with the second surface; an interlayer dielectric layer that covers the first surface; a device isolation part adjacent to the first surface in the substrate, the device isolation part defining an active section in the substrate; and a pixel isolation part in the substrate, the pixel isolation part penetrating the device isolation part and separating pixels from each other. The pixel isolation part may include: a conductive pattern in the substrate and in contact with the fixed charge layer; a buried dielectric pattern between the conductive pattern and the interlayer dielectric layer; and an isolation dielectric pattern that surrounds sidewalls of the conductive pattern and the buried dielectric pattern and is simultaneously in contact with the fixed charge layer and the interlayer dielectric layer. The isolation dielectric pattern may have a first thickness at a level between the buried dielectric pattern and the conductive pattern. The isolation dielectric pattern may have a second thickness at a level of a bottom surface of the fixed charge layer. The second thickness may be different from the first thickness.

According to some example embodiments of the present inventive concepts, an image sensor may comprise: a substrate that has a first surface and a second surface opposite to the first surface; a fixed charge layer in contact with the second surface; an interlayer dielectric layer that covers the first surface; a device isolation part adjacent to the first surface in the substrate, the device isolation part defining an active section in the substrate; and a pixel isolation part in the substrate, the pixel isolation part penetrating the device isolation part and separating pixels from each other. The pixel isolation part may include: a conductive pattern in the substrate and in contact with the fixed charge layer; a buried dielectric pattern between the conductive pattern and the interlayer dielectric layer; and an isolation dielectric pattern that surrounds sidewalls of the conductive pattern and the buried dielectric pattern and is simultaneously in contact with the fixed charge layer and the interlayer dielectric layer. The conductive pattern may have a first sidewall. The isolation dielectric pattern may have a second sidewall. A slope of the first sidewall relative to a bottom surface of the fixed charge layer may be different from a slope of the second sidewall relative to the bottom surface of the fixed charge layer.

According to some example embodiments of the present inventive concepts, an image sensor may comprise: a substrate that has a first surface and a second surface opposite to the first surface, the substrate including first to fourth pixels that are disposed along a clockwise direction; a fixed charge layer in contact with the second surface; a transfer gate on the first surface of the substrate on each of the first to fourth pixels; an interlayer dielectric layer that covers the first surface of the substrate; and a pixel isolation part in the substrate and between the first to fourth pixels, the pixel isolation part separating the first to fourth pixels from each other. The pixel isolation part may include: a conductive pattern in the substrate and in contact with the fixed charge layer; a buried dielectric pattern between the conductive pattern and the interlayer dielectric layer; and an isolation dielectric pattern that surrounds sidewalls of the conductive pattern and the buried dielectric pattern and is simultaneously in contact with the fixed charge layer and the interlayer dielectric layer. The isolation dielectric pattern may have a first thickness at a level between the buried dielectric pattern and the conductive pattern. The isolation dielectric pattern may have a second thickness at a level of a bottom surface of the fixed charge layer. The second thickness may be about 1.2 times to about 2 times the first thickness.

According to some example embodiments of the present inventive concepts, a method of fabricating an image sensor may comprise: forming a deep trench in a substrate; forming an isolation dielectric layer that covers an inner sidewall and a bottom surface of the deep trench, wherein the isolation dielectric layer does not completely fill the deep trench, and wherein a thickness of the isolation dielectric layer is proportional to distance from an entrance of the deep trench; stacking on the isolation dielectric layer a conductive layer to fill the deep trench; and etching back the conductive layer to form a conductive pattern in the deep trench.

BRIEF DESCRIPTION OF THE DRAWINGS

FIG. 5 illustrates a cross-sectional view taken along line A-A' of FIG. 3 or 4 according to some example embodiments of the present inventive concepts.

FIGS. 8A, 8B, 8C, 8D, 8E, and 8F illustrate cross-sectional views showing a method of fabricating an image sensor having a cross-section of FIG. 5 according to some example embodiments of the present inventive concepts.

DETAILED DESCRIPTION

Figure 1:
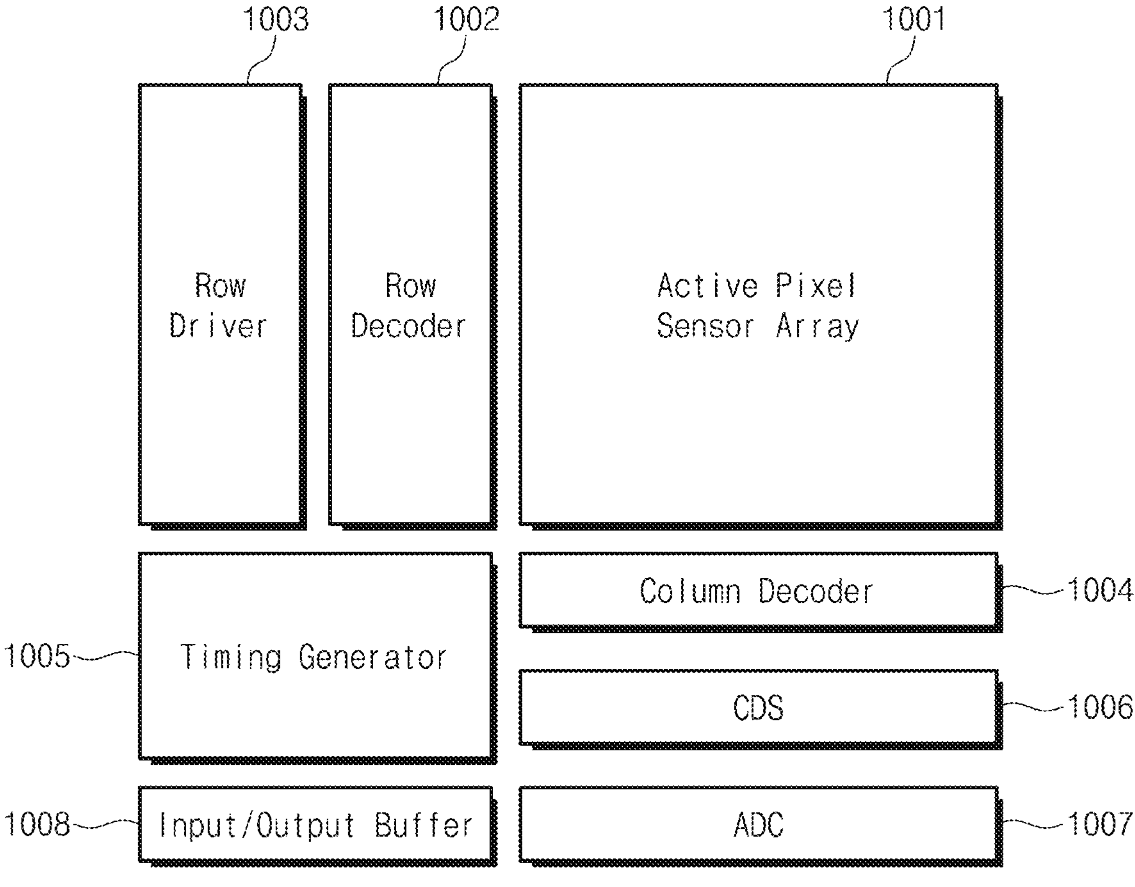
FIG. 1 illustrates a block diagram showing an image sensor according to some example embodiments of the present inventive concepts.

Some example embodiments of the present inventive concepts will now be described in detail with reference to the accompanying drawings to aid in clearly explaining the present inventive concepts. In this specification, terms indicating an order such as first, and second, are used to distinguish components having the same/similar functions as/to each other, and the first and second may be changed depending on an order in which they are mentioned.

It will be understood that when an element is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

FIG. 1 illustrates a block diagram showing an image sensor according to some example embodiments of the present inventive concepts.

Referring to FIG. 1, an image sensor may include an active pixel sensor array 1001, a row decoder 1002, a row driver 1003, a column decoder 1004, a timing generator 1005, a correlated double sampler (CDS) 1006, an analog-to-digital converter (ADC) 1007, and an input/output (I/O) buffer 1008.

The active pixel sensor array 1001 may include a plurality of two-dimensionally arranged unit pixels, each of which is configured to convert optical signals into electrical signals. The active pixel sensor array 1001 may be driven by a plurality of driving signals such as a pixel selection signal, a reset signal, and a charge transfer signal from the row driver 1003. The correlated double sampler 1006 may be provided with the converted electrical signals.

The row driver 1003 may provide the active pixel sensor array 1001 with several driving signals for driving several unit pixels in accordance with a decoded result obtained from the row decoder 1002. When the unit pixels are arranged in a matrix shape, the driving signals may be provided for respective rows.

The timing generator 1005 may provide timing and control signals to the row decoder 1002 and the column decoder 1004.

The correlated double sampler 1006 may receive the electrical signals generated from the active pixel sensor array 1001 and may hold and sample the received electrical signals. The correlated double sampler 1006 may perform a double sampling operation to sample a specific noise level and a signal level of the electrical signal, and then may output a difference level corresponding to a difference between the noise and signal levels.

The analog-to-digital converter (ADC) 1007 may convert analog signals, which correspond to the difference level received from the correlated double sampler 1006, into digital signals, and then output the converted digital signals.

The input/output (I/O) buffer 1008 may latch the digital signals and then sequentially output the latched digital signals to an image signal processing unit (not shown) in response to the decoded result obtained from the column decoder 1004.

As described herein, any devices, electronic devices, modules, units, circuits, and/or portions thereof according to any of the example embodiments, and/or any portions thereof (including, without limitation, the image sensor shown in FIG. 1 and/or an electronic device including such an image sensor, the active pixel sensor array 1001, the row decoder 1002, the row driver 1003, the column decoder 1004, the timing generator 1005, the CDS 1006, the ADC 1007, the I/O buffer 1008, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., a CPU) configured to execute the program of instructions to implement the functionality and/or methods performed by some or all of any devices, electronic devices, modules, units, circuits, and/or portions thereof, according to any of the example embodiments, including any of the methods according to any of the example embodiments.

Any of the memories described herein may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

Figure 2:
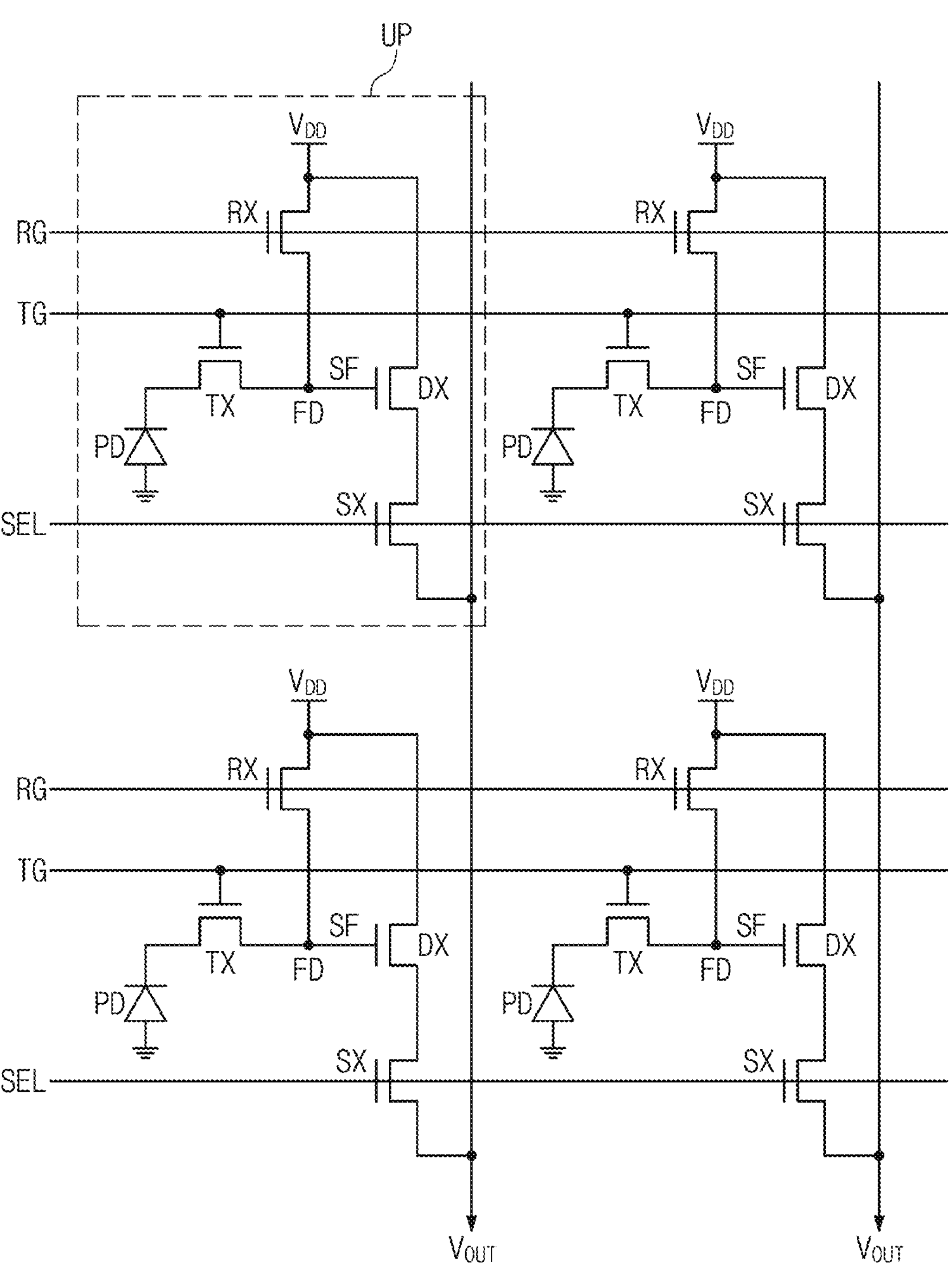
FIG. 2 illustrates a circuit diagram showing an active pixel sensor array of an image sensor according to some example embodiments of the present inventive concepts.

FIG. 2 illustrates a circuit diagram showing an active pixel sensor array of an image sensor according to some example embodiments of the present inventive concepts.

Referring to FIGS. 1 and 2, the active pixel sensor array 1001 may include a plurality of unit pixels UP, which unit pixels UP may be arranged in a matrix shape. Each unit pixel UP may include a transfer transistor TX. Each unit pixel UP may further include logic transistors RX, SX, and DX. The logic transistors RX, SX, and DX may include a reset transistor RX, a selection transistor SX, and a source follower transistor DX. The transfer transistor TX may include a transfer gate electrode TG. Each of the unit pixels UP may further include a photoelectric conversion element PD and a floating diffusion region FD. The logic transistors RX, SX, and DX may be shared by a plurality of unit pixels UP.

The photoelectric conversion element PD may create and accumulate photo-charges in proportion to an amount of externally incident light. The photoelectric conversion element PD may include a photodiode, phototransistor, a photogate, a pinned photodiode, or a combination thereof. The transfer transistor TX may transfer charges generated in the photoelectric conversion element PD into the floating diffusion region FD. The floating diffusion region FD may accumulate and store charges that are generated and transferred from the photoelectric conversion element PD. The source follower transistor DX may be controlled by an amount of photo-charges accumulated in the floating diffusion region FD.

The reset transistor RX may periodically reset the charges accumulated in the floating diffusion region FD. The reset transistor RX may have a drain electrode connected to the floating diffusion region FD and a source electrode connected to a power voltage $V_{DD}$. When the reset transistor RX is turned on, the floating diffusion region FD may be supplied with the power voltage $V_{DD}$ connected to the source electrode of the reset transistor RX. Accordingly, when the reset transistor RX is turned on, the charges accumulated in the floating diffusion region FD may be exhausted and thus the floating diffusion region FD may be reset.

The source follower transistor DX including a source follower gate electrode SF may serve as a source follower buffer amplifier. The source follower transistor DX may amplify a variation in electrical potential of the floating diffusion region FD and may output the amplified electrical potential to an output line $V_{OUT}$.

The selection transistor SX including a selection gate electrode SEL may select each row of the unit pixel P to be readout. When the selection transistor SX is turned on, the power voltage $V_{DD}$ may be applied to a drain electrode of the source follower transistor DX.

Figure 3:
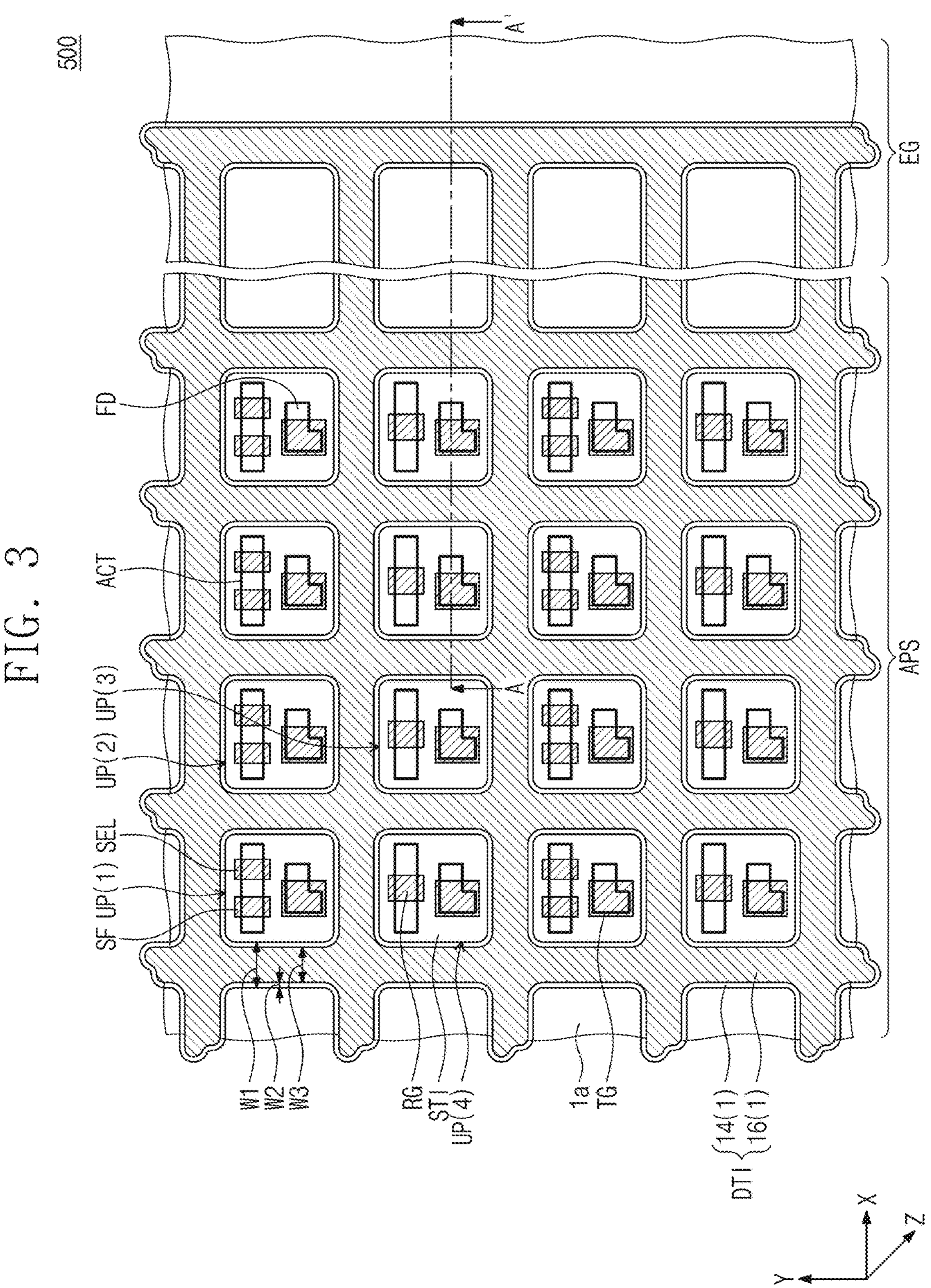
FIG. 3 illustrates a top side view showing an image sensor according to some example embodiments of the present inventive concepts.
Figure 4:
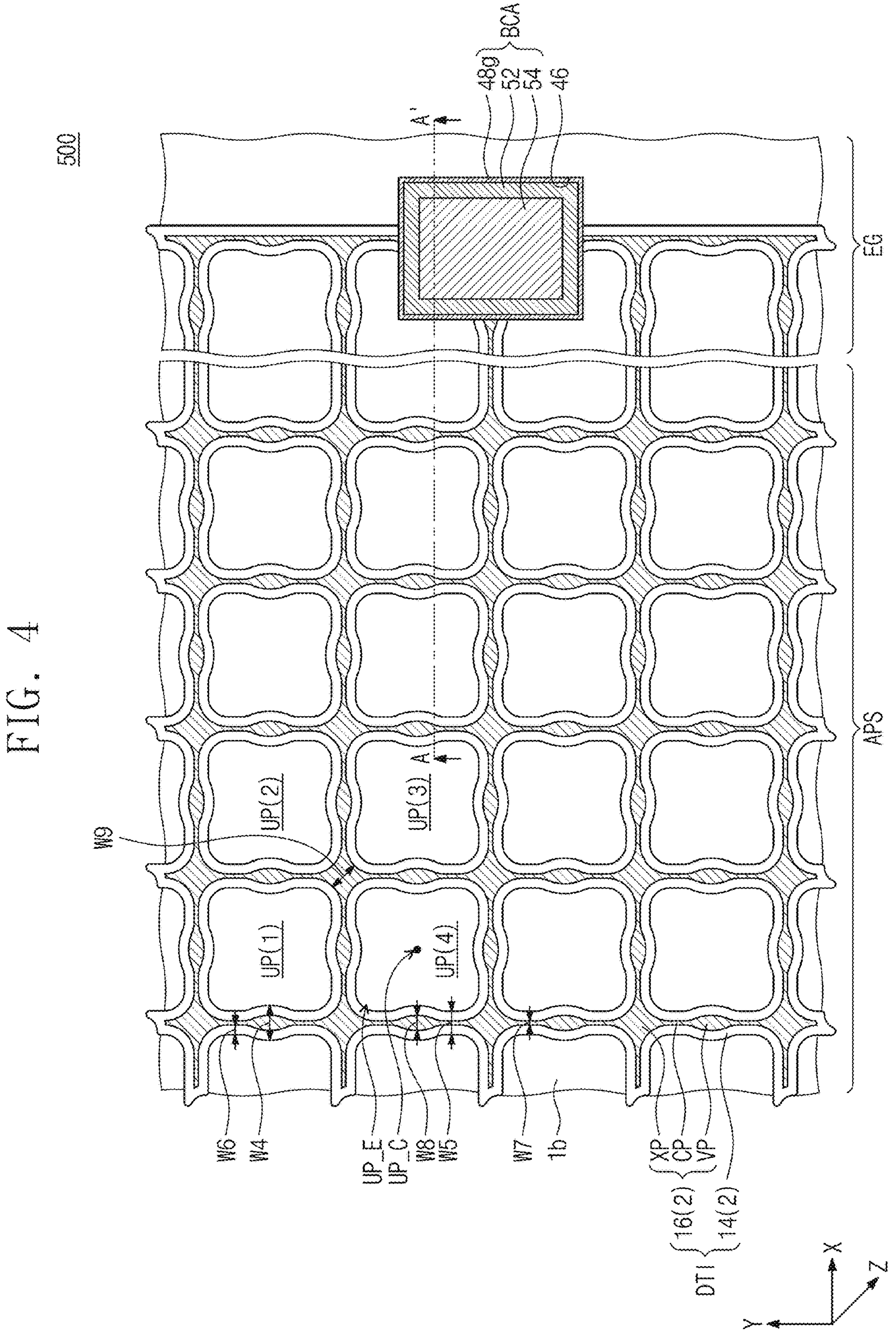
FIG. 4 illustrates a bottom plan view showing an image sensor according to some example embodiments of the present inventive concepts.
Figure 5:
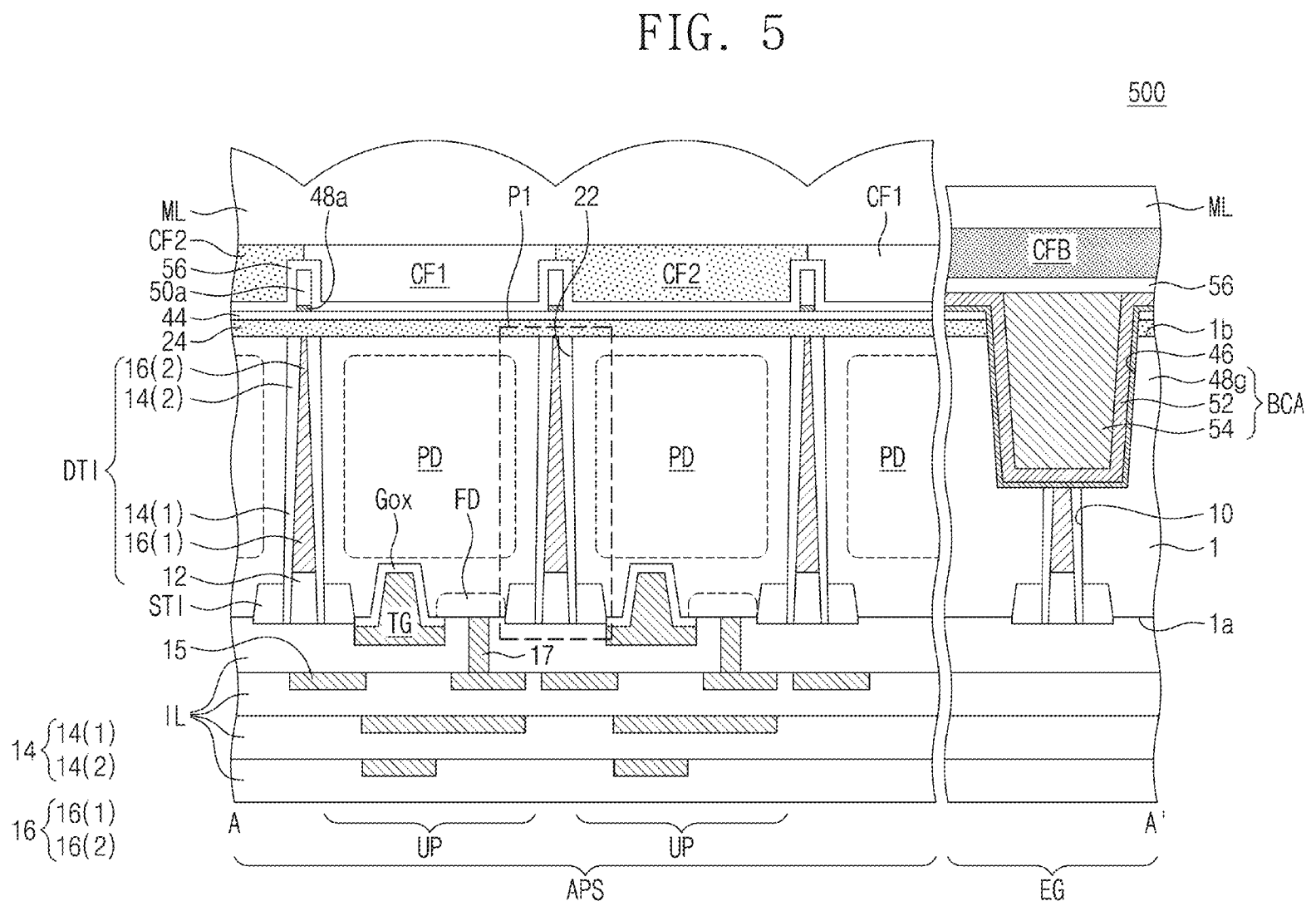
Figure 6A:
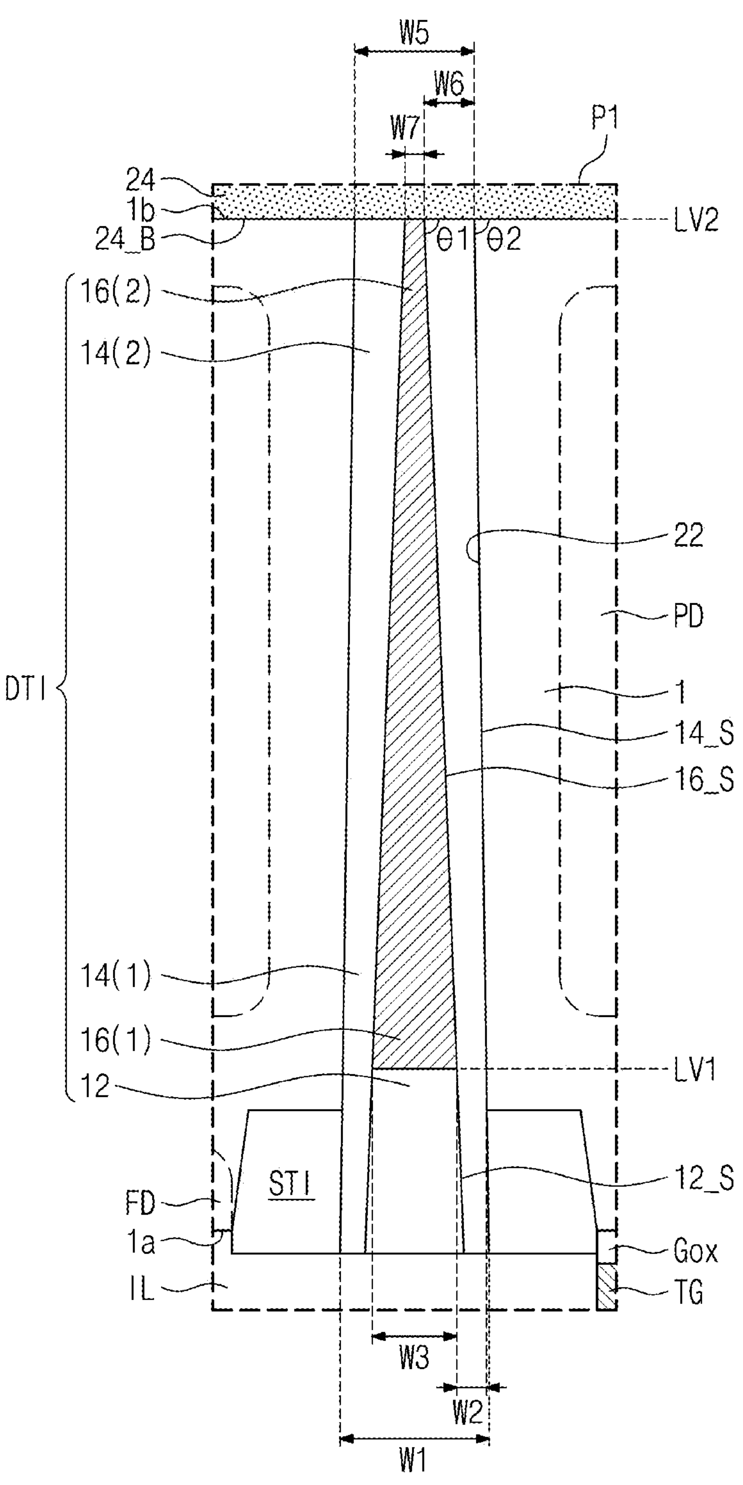
FIGS. 6A, 6B, and 6C illustrate enlarged views showing section P1 of FIG. 5 according to some example embodiments of the present inventive concepts.
Figure 6B:
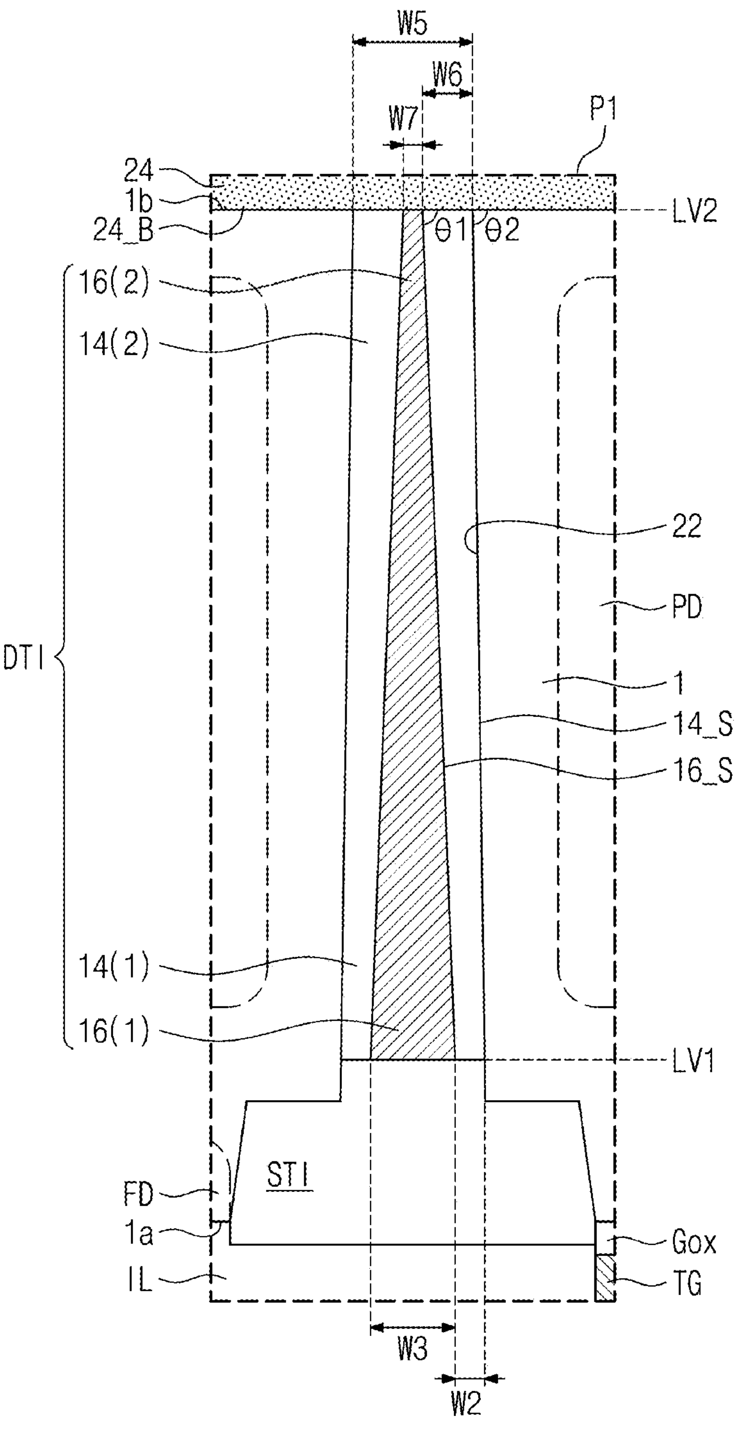
Figure 6C:
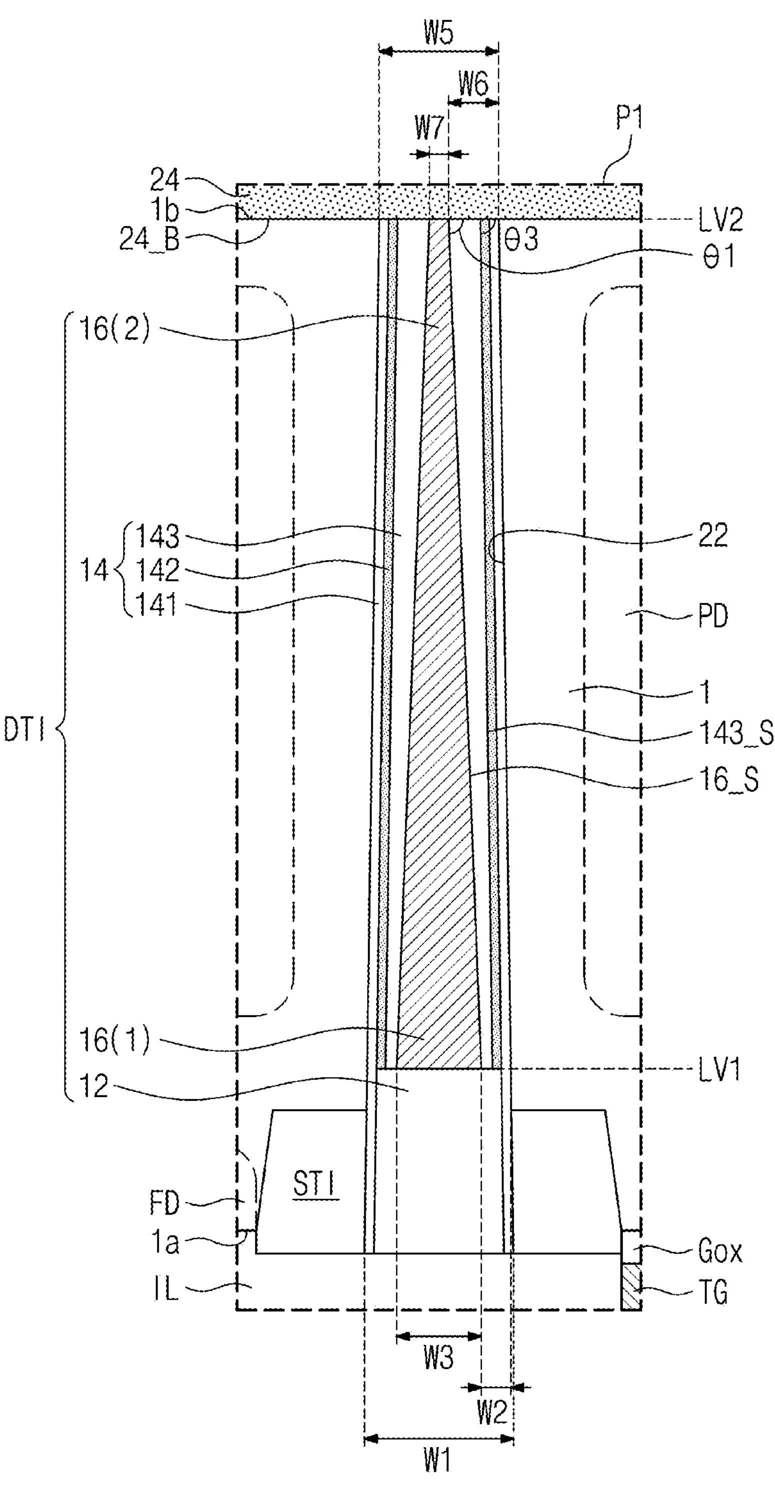

FIG. 3 illustrates a top plan view showing an image sensor according to some example embodiments of the present inventive concepts. FIG. 4 illustrates a bottom plan view showing an image sensor according to some example embodiments of the present inventive concepts. FIG. 5 illustrates a cross-sectional view taken along line A-A' of FIG. 3 or 4 according to some example embodiments of the present inventive concepts. FIGS. 6A, 6B, and 6C illustrate enlarged views showing section P1 of FIG. 5 according to some example embodiments of the present inventive concepts.

Referring to FIGS. 3, 4, and 5, a first substrate 1 may be included in an image sensor 500 according to some example embodiments of the present inventive concepts. The first substrate 1 may be, for example, a monocrystalline silicon wafer, a silicon epitaxial layer substrate, or a silicon-on-insulator (all) substrate. The first substrate 1 may be doped with impurities having a first conductivity type. For example, the first conductivity type may be a p-type. The first substrate 1 may have a front surface 1*a* and a rear surface 1*b* that are opposite to each other. In this description, the front surface 1*a* may be called a first surface, and the rear surface 1*b* may be called a second surface. The first substrate 1 may include a pixel array area APS and an edge area EG. The pixel array area APS may include a plurality of unit pixels UP. The edge area EG may correspond to a portion of an optical black area OB of FIG. 13.

The first substrate 1 may be provided therein with a pixel isolation part DTI that separates and limits (e.g., isolates) the unit pixels UP on the pixel array area APS from each other (e.g., isolate separate unit pixels UP from direct contact with each other in the first direction X and/or the second direction Y). The pixel isolation part DTI may be located within the first substrate 1 (e.g., at least partially or entirely within an interior of the first substrate 1 between the front and rear surfaces 1*a* and 1*b* of the first substrate 1) As shown in at least FIGS. 3-4, the pixel isolation part DTI may extend to the edge area EG. The pixel isolation part DTI may have a network shape (e.g., a grid shape, mesh shape, etc.) when viewed in plan.

The pixel isolation part DTI may be positioned in (e.g., within) a deep trench 22 that is formed from the front surface 1*a* toward the rear surface 1*b* of the first substrate 1 (e.g., at least partially defined by one or more inner surfaces of the first substrate 1 which extend from the front surface 1*a* toward the rear surface 1*b*). The pixel isolation part DTI may include a buried dielectric pattern 12, an isolation dielectric pattern 14, and a conductive pattern 16. The buried dielectric pattern 12 may be interposed between (e.g., between in the third direction Z) the conductive pattern 16 and a first interlayer dielectric layer IL which will be discussed below. The isolation dielectric pattern 14 may be interposed between (e.g., between in the first direction X and/or the second direction Y) the conductive pattern 16 and the first substrate 1 and between (e.g., between in the first direction X and/or the second direction Y) the buried dielectric pattern 12 and the first substrate 1. For example, as shown, the isolation dielectric pattern may surround (e.g., in the first direction X and/or the second direction Y), and may contact, respective sidewalls 16_S and 12_S of the conductive pattern 16 and the buried dielectric pattern 12 and is simultaneously in contact with (e.g., in contact with both of) the fixed charge layer 24 (e.g., the bottom surface 24_B of the fixed charge layer 24) and the first interlayer dielectric layer IL.

The buried dielectric pattern 12 and the isolation dielectric pattern 14 may be formed of (e.g., may comprise) a dielectric material whose refractive index is different from that of the first substrate 1. The buried dielectric pattern 12 and the isolation dielectric pattern 14 may include, for example, silicon oxide. The conductive pattern 16 may be spaced apart from (e.g., isolated from direct contact with) the first substrate 1. The conductive pattern 16 may include an impurity-doped polysilicon layer or a silicon-germanium layer. For example, one of boron, phosphorus, or arsenic may be adopted as impurities doped into the polysilicon layer or the silicon-germanium layer. In some example embodiments, the conductive pattern 16 may include a metal layer.

As shown in FIG. 5, the pixel isolation part DTI may have a width that decreases in a direction from the front surface 1*a* toward the rear surface 1*b* of the first substrate 1. As shown in FIG. 3, the pixel isolation part DTI may a first width W1 in a first direction X or a second direction Y adjacent to the front surface 1*a* of the first substrate 1. In this description, the language "width" may be replaced with the language "thickness" in a specific direction.

As shown, the first direction X may be understood to extend parallel to (e.g., extend in parallel with) at least one of the front surface 1*a* or the rear surface 1*b* of the first substrate 1 and in some example embodiments may be referred to as extending parallel to the first substrate 1 based on extending parallel to at least one of the front surface 1*a* or the rear surface 1*b* of the first substrate 1. As further shown, the second direction Y may be understood to extend parallel to (e.g., extend in parallel with) at least one of the front surface 1*a* or the rear surface 1*b* of the first substrate 1 (in addition to intersecting the first direction X, which may include extending perpendicular to the first direction X), and in some example embodiments may be referred to as extending parallel to the first substrate 1 based on extending parallel to at least one of the front surface 1*a* or the rear surface 1*b* of the first substrate 1.

Referring to at least FIG. 6A, at a first level LV1 of an interface between the conductive pattern 16 and the buried dielectric pattern 12, which may be shown in the view of FIG. 3, a first portion 14(1) of the isolation dielectric pattern 14 may have a second width W2 in the first direction X or the second direction Y. At the first level LV1, a first portion 16(1) of the conductive pattern 16 may have a third width W3 in the first direction X or the second direction Y.

In the present specification, the term 'level', 'vertical level', 'depth', 'height', or the like may mean a vertical height (e.g., vertical distance in the third direction Z) measured from a reference location (e.g., the front surface 1*a* and/or the rear surface 1*b* of the first substrate 1) in a direction perpendicular to the plane or surface at the reference location (e.g., the third direction Z, which may be a vertical direction perpendicular to the front surface 1*a* and/or the rear surface 1*b* of the first substrate 1). For example, where elements (e.g., surfaces) are described herein to be at different levels, it will be understood that the respective distances of the elements from the reference location (e.g., the front surface 1*a* of the first substrate 1) in the vertical direction (e.g., third direction Z) may be different from each other. In another example, where a level of a first element is described herein to be between at least two other elements, it will be understood that the first element is between the at least two other elements in the vertical direction. In another example, where a level of a first element is described herein to be lower, less, or smaller than a level of a second element, it will be understood that the distance of the first element from the reference location (e.g., the front surface 1*a* of the first substrate 1) in the vertical direction may be smaller than the distance of the second element from the reference location in the vertical direction. In another example, where a level of a first element is described herein to be higher, larger, or greater than a level of a second element, it will be understood that the distance of the first element from the reference location (e.g., the front surface 1*a* of the first substrate 1) in the vertical direction may be greater than the distance of the second element from the reference location in the vertical direction. In another example, where a level of a first element is described herein to be the same or substantially the same as a level of a second element or "at" the level of the second element, it will be understood that the distance of the first element from the reference location (e.g., the front surface 1*a* of the first substrate 1) in the vertical direction may be the same or substantially the same as the distance of the second element from the reference location in the vertical direction. In some example embodiments, a 'height' of an element may refer to a dimension of the element in the vertical direction (e.g., length of the element between opposing top/bottom surfaces of the element in the vertical direction). The vertical direction as described herein may be the third direction Z which may be perpendicular to both the first and second directions X1 and X2.

As shown in FIG. 4, the pixel isolation part DTI of the first substrate 1 may have a sidewall that has an uneven structure on the rear surface 1*b*. When viewed in plan as shown in FIG. 4, the sidewall of the pixel isolation part DTI may be convex adjacent (e.g., proximate) to a center UP_C of the unit pixel UP. The pixel isolation part DTI may have a fourth width W4 in the first direction X adjacent to the center UP_C of the unit pixel UP. The sidewall of the pixel isolation part DTI may be concave adjacent (e.g., proximate) to a corner UP_E of the unit pixel UP. The pixel isolation part DTI may have a fifth width W5 either adjacent to the corner UP_E of the unit pixel UP or at a level LV2 of a bottom surface 24_B of a fixed charge layer 24 which will be discussed below. Each of the fourth and fifth widths W4 and W5 may be less than the first width W1. The fifth width W5 may be less (e.g., smaller) than the fourth width W4.

Referring to FIGS. 4 and 6A, a second portion 14(2) of the isolation dielectric pattern 14 may have a sixth width W6 in the first direction X or the second direction Y either on (e.g., at) the rear surface 1*b* of the first substrate 1 or at the level LV2 of the bottom surface 24_B of the fixed charge layer 24. As shown, the level LV2 of the bottom surface 24_B of the fixed charge layer 24 may be the same as the level of the rear surface 1*b* of the first substrate 1. The sixth width W6 of FIG. 4 may be greater than the second width W2 of FIG. 3 or 6A.

When viewed in plan as shown in FIG. 4, a second portion 16(2) of the conductive pattern 16 may have a convex segment VP, a concave segment CP, and a connection segment XP on the rear surface 1*b* of the first substrate 1. The convex segment VP may be adjacent to the center UP_C of the unit pixel UP. The concave segment CP may be adjacent to the corner UP_E of the unit pixel UP. The connection segment XP may be most adjacent to the corner UP_E of the unit pixel UP and positioned between the concave segments CP. The concave segment CP may have a seventh width W7 in the first direction X, for example, at the level LV2 of the bottom surface 24_B of the fixed charge layer 24. The convex segment VP may have an eighth width W8 in the first direction X. Each of the seventh and eighth widths W7 and W8 of FIG. 4 may be less than the third width W3 of FIG. 3 or 6A. The seventh width W7 may be less than the eighth width W8. The connection segment XP may have a ninth width W9 in a third direction Z. The third direction Z may intersect both of the first and second directions X and Y. The ninth width W9 may be greater than the seventh width W7. A value W5/W1 (e.g., a value of a ratio of W5/W1) obtained by dividing the fifth width W5 by the first width W1 may be greater than a value W7/W3 (e.g., a value of a ratio of W7/W3) obtained by dividing the seventh width W7 by the third width W3.

The pixel isolation part DTI of the image sensor 500 according to some example embodiments may be configured such that the isolation dielectric pattern 14 satisfies a condition that the sixth width W6 is greater than the second width W2 (W6>W2), it may be possible to increase a total reflection ratio and to improve photosensitivity of the image sensor 500, thereby improving operational performance of the image sensor 500, for example in that the image sensor

500 may be configured to generate images in lower-illumination conditions (e.g., darker environments) without loss of image resolution. In addition, for the pixel isolation part DTI of the image sensor 500 according to some example embodiments, the value of the ratio W5/W1 may be greater than the value of the ratio W7/W3. Therefore, when the conductive pattern 16 is formed, a step coverage may be increased and thus no void may be formed in the conductive pattern 16. Accordingly, a negative bias may be uniformly applied to the conductive pattern 16 irrespective of position, and thus the occurrence of dark current may be suppressed in the image sensor 500, thereby improving operational performance of the image sensor 500 due to suppression of dark current generation therein. In addition, backside strength of a product module may be increased to increase a final yield of manufactured image sensors 500 that have reduced or no manufacturing defects (e.g., process defects) based on the improved strength (e.g., structural strength) of the image sensors 500 based on the value of the ratio W5/W1 being greater than the value of the ratio W7/W3.

The first substrate 1 may have therein photoelectric conversion elements PD on corresponding unit pixels UP. The photoelectric conversion elements PD may be doped with impurities having a second conductivity type opposite to the first conductivity type. The second conductivity type may be, for example, an n-type. The n-type impurities doped in the photoelectric conversion element PD and the p-type impurities doped in the first substrate 1 therearound may constitute a PN junction to provide a photodiode.

The first substrate 1 may have therein device isolation parts STI adjacent to the front surface 1*a*. The pixel isolation part DTI may penetrate the device isolation parts STI. On each unit pixel UP, the device isolation parts STI may limit active sections ACT adjacent to the front surface 1*a*. The active sections ACT may be provided for the transistors TX, RX, DX, and SX of FIG. 2.

On each unit pixel UP, a transfer gate electrode TG may be disposed on the front surface 1*a* of the first substrate 1. A portion of the transfer gate electrode TG may extend into the first substrate 1. The transfer gate electrode TG may have a vertical type. In some example embodiments, the transfer gate electrode TG may be a planar type that does not extend into the first substrate 1. A gate dielectric layer Gox may be interposed between the transfer gate electrode TG and the first substrate 1. A floating diffusion region FD may be disposed in the first substrate 1 on one side of the transfer gate electrode TG. The floating diffusion region FD may be doped with impurities having, for example, the second conductivity type.

The image sensor 500 may be a backside illumination image sensor. Light may be incident on the first substrate 1 through the rear surface 1*b* of the first substrate 1. Electron-hole pairs may be created from the incident light at the PN junction. These created electrons may move toward the photoelectric conversion element PD. When a voltage is applied to the transfer gate electrode TG, the electrons may move toward the floating diffusion region FD.

As shown in FIGS. 3 and 4, the unit pixels UP may include first to fourth unit pixels UP(1) to UP(4) that are adjacent to each other along a clockwise direction. The first and second unit pixels UP(1) and UP(2) may be arranged along the first direction X. The fourth and third unit pixels UP(4) and UP(3) may be arranged along the first direction X. The fourth and first unit pixels UP(4) and UP(1) may be arranged along the second direction Y that intersects the first direction X. The third and second pixels UP(3) and UP(2) may be arranged along the second direction Y.

On each of the unit pixels UP(3) and UP(4), the front surface 1*a* may be provided thereon with a reset gate electrode RG adjacent to the transfer gate electrode TG. On each of the unit pixels UP(1) and UP(2), the front surface 1*a* may be provided thereon with a source follower gate electrode SF and a selection gate electrode SEL that are adjacent to the transfer gate electrode TG. The gate electrodes TG, RG, SF, and SEL may correspond to gate electrodes of the transistors TX, RX, DX, and SX, respectively, of FIG. 2. The gate electrodes TG, RG, SF, and SEL may overlap (e.g., in the third direction Z) the active sections ACT. In some example embodiments, the reset transistor RX, the selection transistor SX, and the source follower transistor DX may be shared by two neighboring unit pixels UP (e.g., two adjacent unit pixels UP).

The front surface 1*a* may be covered with first interlayer dielectric layers IL. The first interlayer dielectric layers IL may be formed of a single layer or multiple layers including at least one selected from a silicon oxide layer, a silicon nitride layer, a silicon oxynitride layer, and a porous low-k dielectric layer. The first interlayer dielectric layers IL may be provided with first wiring lines 15 therebetween or therein. The floating diffusion region FD may be connected through a first contact plug 17 to the first wiring lines 15. On the pixel array area APS, the first contact plug 17 may penetrate one (e.g., lowermost one) of the first interlayer dielectric layers IL that is most adjacent to the front surface 1*a*.

A fixed charge layer 24 may be disposed on the rear surface 1*b* of the first substrate 1. The fixed charge layer 24 may be in contact with the rear surface 1*b* of the first substrate 1. The fixed charge layer 24 may be formed of a single layer or multiple layers of either metal oxide including oxygen whose amount is less than its stoichiometric ratio or metal fluoride including fluorine whose amount is less than its stoichiometric ratio. The fixed charge layer 24 may thus have a negative fixed charge. The fixed charge layer 24 may be formed of a single layer or multiple layers of one of metal oxide or metal fluoride that include at least one metal selected from hafnium (Hf), zirconium (Zr), aluminum (Al), tantalum (Ta), titanium (Ti), yttrium (Y), and lanthanides. For example, the fixed charge layer 24 may include one or more of a hafnium oxide layer or an aluminum oxide layer. The fixed charge layer 24 may be configured to suppress dark current and white spot in the image sensor 500.

A first protection layer 44 may be stacked on the fixed charge layer 24. The first protection layer 44 may include at least one selected from plasma-enhanced tetraethyl orthosilicate (PETEOS), SiOC, $SiO_2$, and SiN. The first protection layer 44 may serve as one or more of an antireflection layer or a planarization layer.

As shown in FIG. 6A, a first angle θ1 may be made (e.g., defined) between a sidewall 16_S of the conductive pattern 16 (also referred to herein as a first sidewall) and a bottom surface 24_B of the fixed charge layer 24. A second angle θ2 may be made (e.g., defined) between a sidewall 14_S of the isolation dielectric pattern 14 (also referred to herein as a second sidewall) and the bottom surface 24_B of the fixed charge layer 24. The second angle θ2 may be different from the first angle θ1. For example, the second angle θ2 may be greater than the first angle θ1.

When the device isolation part STI, the isolation dielectric pattern 14, and the buried dielectric pattern 12 are formed of the same material (e.g., silicon oxide), no distinct interface may be provided between the device isolation part STI, the isolation dielectric pattern 14, and the buried dielectric pattern 12. In this case, the device isolation part STI, the isolation dielectric pattern 14, and the buried dielectric pattern 12 may appear as one single body (e.g., the device isolation part STI, the isolation dielectric pattern 14, and the buried dielectric pattern 12 may be separate portions of a single, unitary piece of material). For example, as shown in FIG. 6B, the device isolation part STI may appear to have a T shape.

The isolation dielectric pattern 14 may have a single-layered structure as shown in FIG. 6A. In some example embodiments, as shown in FIG. 6C, the isolation dielectric pattern 14 may include first, second, and third isolation dielectric patterns 141, 142, and 143 that are sequentially disposed in a direction from the first substrate 1 toward the conductive pattern 16. The second isolation dielectric pattern 142 may include a dielectric material whose dielectric constant is different from the respective dielectric constants of the first and third isolation dielectric patterns 141 and 143. For example, the second isolation dielectric pattern 142 may include silicon nitride. The first and third isolation dielectric patterns 141 and 143 may include silicon oxide. In this case, a third angle θ3 may be made between a sidewall 143_S of the third isolation dielectric pattern 143 and the bottom surface 24_B of the fixed charge layer 24. The third angle θ3 may be different (e.g., different in magnitude) from the first angle θ1. For example, the third angle θ3 may be greater than the first angle θ1. The third isolation dielectric pattern 143 may have a width that decreases with reduced distance from (e.g., increased proximity to) the front surface 1*a*. Restated, the third isolation dielectric pattern 143 may have a width having a magnitude that is proportional to distance of the width from the front surface 1*a* in the third direction Z.

The second and third isolation dielectric patterns 142 and 143 may have their respective bottom ends located at the first level LV1. The first isolation dielectric pattern 141 may have a bottom end coplanar with a top surface of the device isolation part STI.

Referring to FIGS. 4 and 5, on the edge area EG, a connection contact BCA may penetrate the first protection layer 44, the fixed charge layer 24, and a portion of the first substrate 1 to come into contact with the conductive pattern 16 and the isolation dielectric pattern 14. The connection contact BCA may be positioned in a third trench 46 at least partially defined by one or more inner surfaces of the first substrate 1. The connection contact BCA may include a diffusion stop pattern 48*g* that conformally covers an inner sidewall and a bottom surface of the third trench 46, a first metal pattern 52 on the diffusion stop pattern 48*g*, and a second metal pattern 54 that fills the third trench 46. The diffusion stop pattern 48*g* may include, for example, titanium. The first metal pattern 52 may include, for example, tungsten. The second metal pattern 54 may include, for example, aluminum. The diffusion stop pattern 48*g* and the first metal pattern 52 may extend onto the first protection layer 44 to come into electrical connection with other wiring lines, vias, and/or contacts.

On the pixel array area APS, light-shield patterns 48*a* may be disposed on the first protection layer 44. Low-refractive patterns 50*a* may be correspondingly disposed on the light-shield patterns 48*a*. The light-shield pattern 48*a* and the low-refractive pattern 50*a* may overlap the pixel isolation part DTI and may have a grid shape when viewed in plan. The light-shield pattern 48*a* may include, for example, titanium. The low-refractive pattern 50*a* may have the same thickness and may include the same organic material. The low-refractive pattern 50*a* may have a refractive index less than those of color filters CF1 and CF2 which will be discussed below. For example, the low-refractive pattern 50*a* may have a refractive index equal to or less than about 1.3 (e.g., about 0.01 to about 1.3, about 0.1 to about 1.3, etc.). The light-shield pattern 48*a* and the low-refractive pattern 50*a* may reduce, minimize, or prevent crosstalk between neighboring unit pixels UP.

A second protection layer 56 may be stacked on the first protection layer 44. The second protection layer 56 may conformally cover the light-shield pattern 48*a*, the low-refractive pattern 50*a*, and the connection contact BCA. On the pixel array area APS, color filters CF1 and CF2 may be disposed between the low-refractive patterns 50*a*. Each of the color filters CF1 and CF2 may have (e.g., may be configured to selectively transmit) one of blue, green, or red colors. In some example embodiments, the color filters CF1 and CF2 may include (e.g., may be configured to selectively transmit) different colors such as cyan, magenta, or yellow.

In the image sensor 500 according to some example embodiments, the color filters CF1 and CF2 may be arranged in Bayer pattern. In some example embodiments, the color filters CF1 and CF2 may be arranged in one of 2×2 Tetra, 3×3 Nona, and 4×4 Hexadeca patterns.

On the edge area EG, a first optical black pattern CFB may be disposed on the second protection layer 56. The first optical black pattern CFB may include, for example, the same material as that of a blue color filter.

On the pixel array area APS, microlenses ML may be disposed on the color filters CF1 and CF2. The microlenses ML may have their edges that are in contact with and connected to each other.

On the edge area EG, a lens residual layer MLR may be disposed on the first optical black pattern CFB. The lens residual layer MLR may include the same material as that of the microlenses ML.

A negative bias voltage may be applied through the connection contact BCA to the conductive patterns 16. The conductive patterns 16 may serve as a common bias line. Therefore, holes possibly present a surface of the first substrate 1 in contact with the pixel isolation parts DTI may be trapped to improve dark current characteristics of the image sensor 500, thereby improving operational performance of the image sensor 500.

Figure 7:
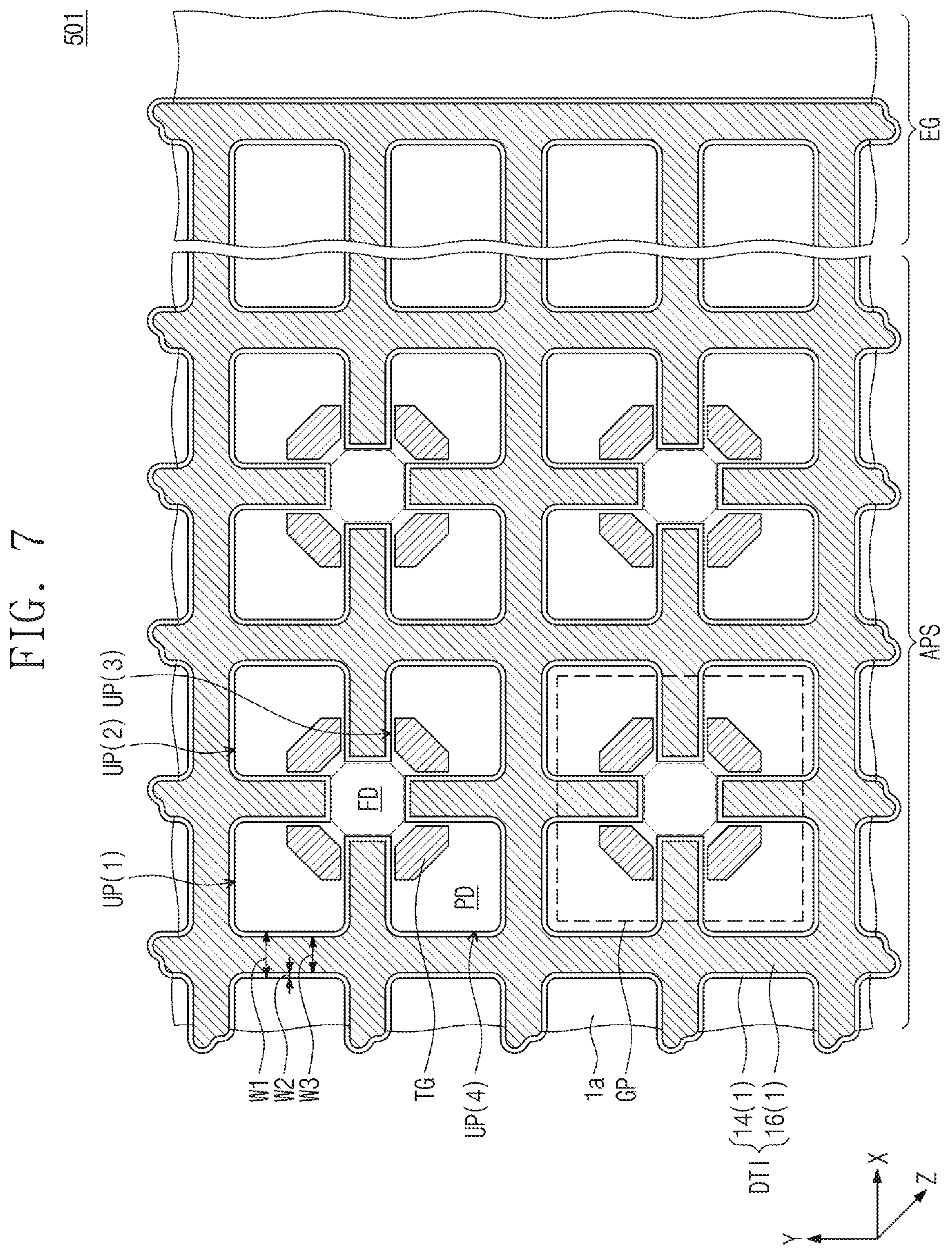
FIG. 7 illustrates a top plan view showing an image sensor according to some example embodiments of the present inventive concepts.

FIG. 7 illustrates a top plan view showing an image sensor according to some example embodiments of the present inventive concepts. A cross section taken along line A-A' of FIG. 7 may be identical or similar to FIG. 5.

Referring to FIG. 7, an image sensor 501 according to some example embodiments may include a single pixel group GP that is constituted by the first to fourth unit pixels UP(1) to UP(4) arranged along a clockwise direction. The pixel isolation part DTI may not be disposed on (e.g., may be absent from) a center of the pixel group GP. The floating diffusion region FD may be disposed on the center of the pixel group GP. The first to fourth unit pixels UP(1) to UP(4) may be correspondingly provided thereon with the transfer gate electrodes TG adjacent to the floating diffusion region FD. One floating diffusion region FD may be shared by the first to fourth unit pixels UP(1) to UP(4) included in one pixel group GP. Although not shown, one pixel group GP may be provided thereon with one color filter and one microlens. Other configurations may be identical or similar to those discussed with reference to FIGS. 3 to 6C.

FIGS. 8A, 8B, 8C, 8D, 8E, and 8F illustrate cross-sectional views showing a method of fabricating an image sensor having a cross-section of FIG. 5.

Figure 8A:
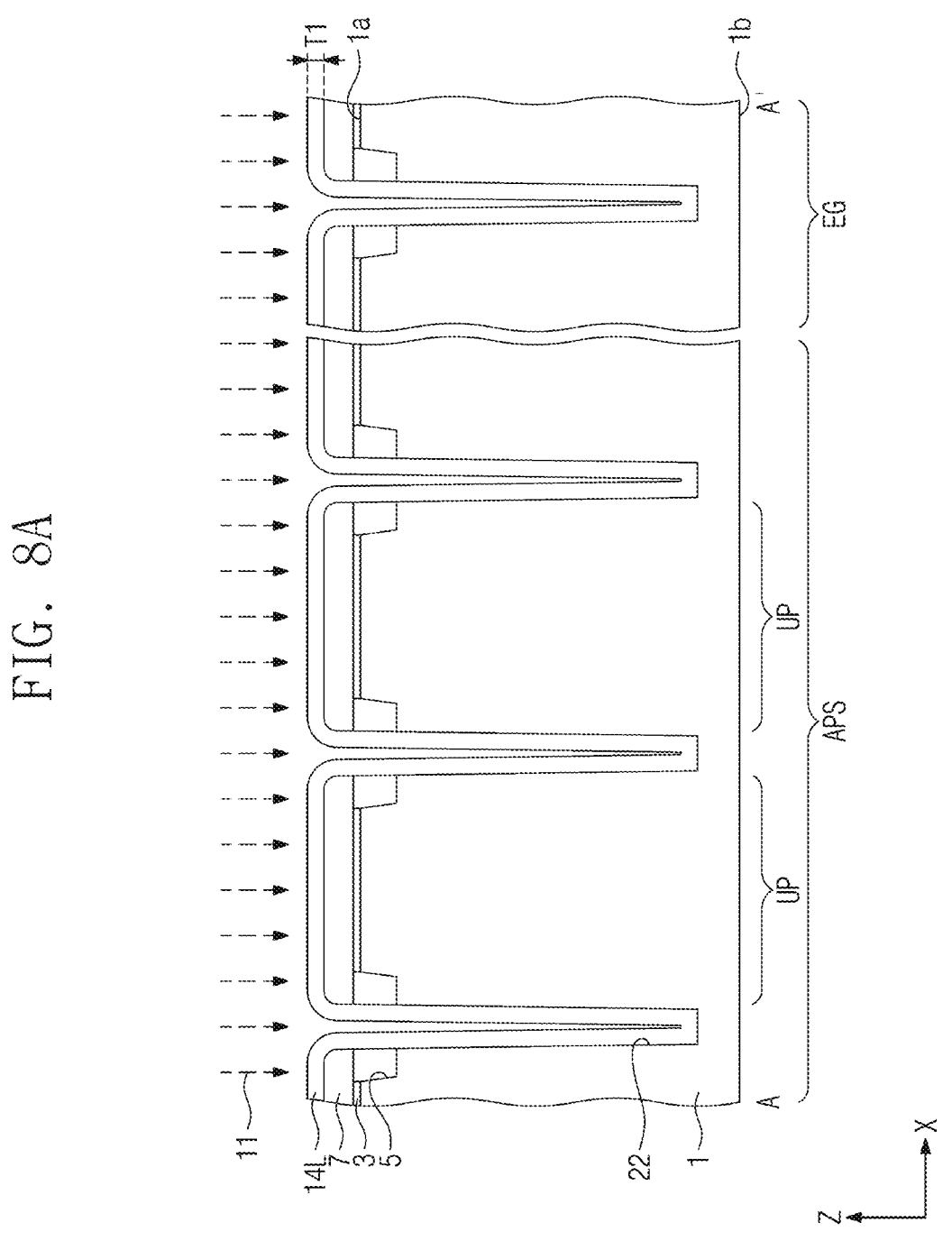

Referring to FIG. 8A, a first substrate 1 may be prepared which includes a pixel array area APS and an edge area EG.

A first mask pattern 3 may be formed on a front surface of the first substrate 1. The first mask pattern 3 may include, for example, silicon oxide. The first mask pattern 3 may limit positions of active sections ACT on the front surface 1*a*. The first mask pattern 3 may be used as an etching mask to etch the front surface 1*a* of the first substrate 1 to form a shallow trench 5.

A second mask pattern 7 may be formed on the front surface 1*a* of the first substrate 1. The second mask pattern 7 may cover the first mask pattern 3 and fill a portion of the shallow trench 5. The second mask pattern 7 may limit a position of a pixel isolation part. The second mask pattern 7 may expose a bottom surface of the shallow trench 5. The second mask pattern 7 may have a single-layered or multi-layered structure including at least one selected from silicon oxide, SiN, SiCN, and SiOCN. The second mask pattern 7 may be used as an etching mask to etch the first substrate 1 to form a deep trench 22. When the deep trench 22 is formed, an interference between etchants may cause the deep trench 22 to have a bottom surface whose planar shape is identical or similar to that of the pixel isolation part DTI shown in FIG. 4.

As shown in FIG. 8A, atomic layer deposition (ALD) may be employed to conformally form an isolation dielectric layer 14L on the front surface 1*a* of the first substrate 1 in which the deep trench 22 is formed. The isolation dielectric layer 14L may have a first thickness T1 that is constant irrespective of position. The isolation dielectric layer 14L may be formed to have a single-layered or multi-layered structure of at least one selected from silicon oxide, silicon nitride, silicon oxynitride, and silicon carbonitride.

Figure 8B:
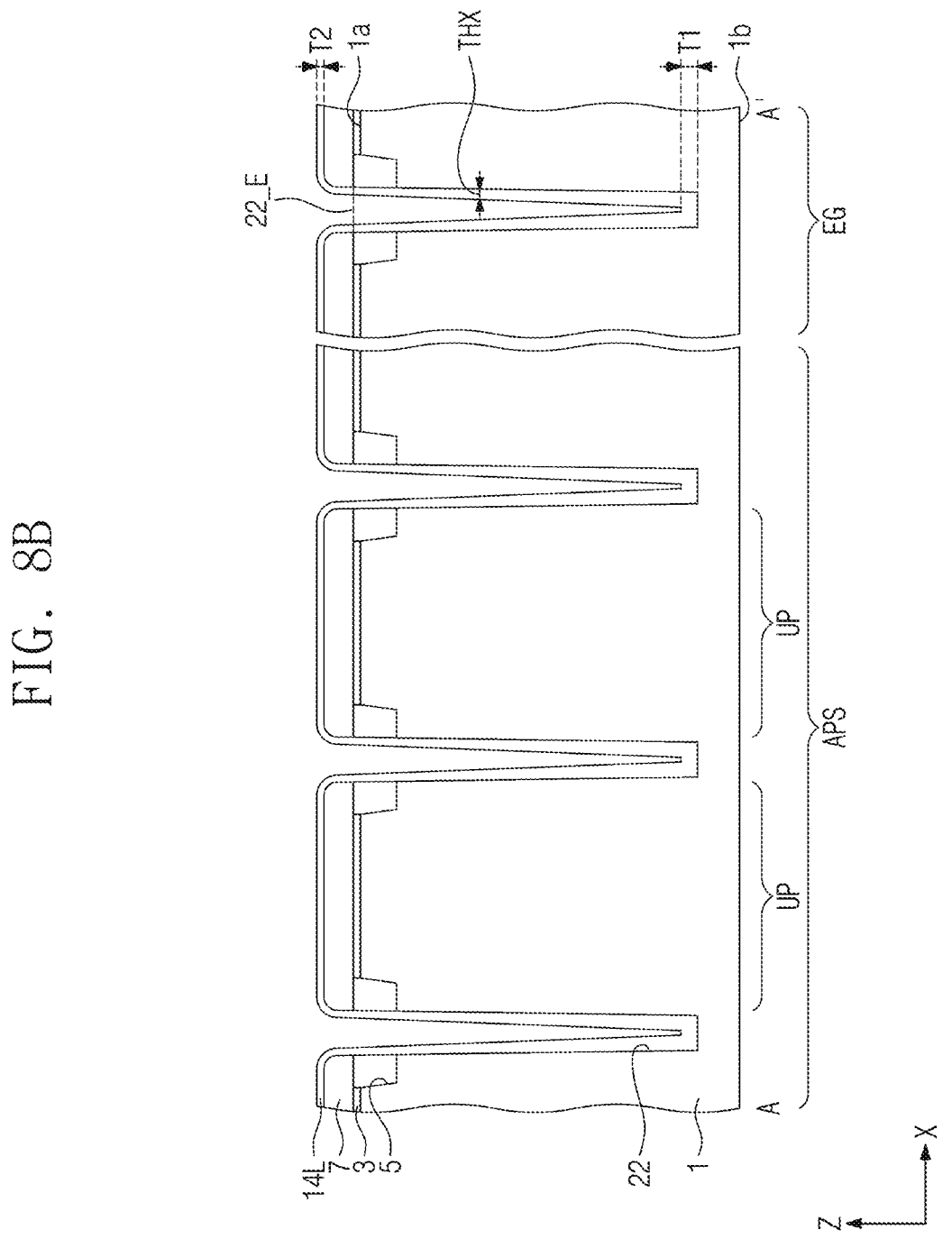

Referring to FIGS. 8A and 8B, an anisotropic etching process 11 may be performed on the isolation dielectric layer 14L. In the anisotropic etching process 11, an increase in depth of the deep trench 22 (e.g., depth in the third direction Z from the front surface 1*a* of the first substrate 1 from an outside toward an inside of the deep trench 22) may cause an increase in difficulty in introducing an etchant into the deep trench 22. Therefore, the isolation dielectric layer 14L may have a thickness THX that progressively increases in a direction from an outside toward an inside of the deep trench 22 (e.g., the magnitude of THX in the first and/or second directions X and/or Y is proportional to distance of THX in the third direction Z from the entrance 22_E of the deep trench 22). For example, the isolation dielectric layer 14L may have a second thickness T2 at the outside of the deep trench 22 (e.g., external to the first substrate 1) and the first thickness T1, which is greater than the second thickness T2, at the bottom surface of the deep trench 22 (e.g., within the first substrate 1 at the furthest point in the deep trench 22 from the front surface 1*a*).

In some example embodiments, without the procedure of FIG. 8A, the isolation dielectric layer 14L may be formed to have a thickness THX (e.g., in the first and/or second directions X and/or Y) that is changed based on a depth (e.g., in the third direction Z) of the deep trench 22 as shown in FIG. 8B. When the isolation dielectric layer 14L is formed of (e.g., comprises) silicon oxide, the formation of the isolation dielectric layer 14L may include performing several times (e.g., repeatedly performing, performing at least twice, etc.) a process that includes a step of forming a silicon atomic layer, a step of forming an oxygen atomic layer, and a step of performing an in-situ plasma etching process, which steps constitute one cycle of the process. For example, the formation of the isolation dielectric layer 14L may include performing several such cycles of the process. The in-situ plasma etching process may be executed by using one or more of oxygen, hydrogen, and argon. In the in-situ plasma etching process, a silicon atomic layer and/or an oxygen atomic layer positioned on a shallower location in the deep trench 22 (e.g., a location closer to the front surface 1*a* in the third direction Z) may be more exposed to plasma, and thus the plasma may increase probability of separation of hydrogen atoms (H) from —OH groups present on surfaces of the silicon atomic layer and/or the oxygen atomic layer. When one or more subsequent cycles are performed, neither the silicon atomic layer nor the oxygen atomic layer may be favorably deposited on the location where the hydrogen atom (H) is separated. Therefore, as shown in FIG. 8B, the isolation dielectric layer 14L may be formed to have the first thickness T1 at the inside of the deep trench 22 and the second thickness T2, which is less than the first thickness T1, at the outside of the deep trench 22.

In some example embodiments, when the isolation dielectric layer 14L is formed of silicon oxide, the formation of the isolation dielectric layer 14L may include performing several times (e.g., repeatedly performing, performing at least twice, etc.) a process that includes a step of forming an inhibitor material on an entrance side or an outer side of the deep trench 22, a step of forming a silicon atomic layer, and a step of forming an oxygen atomic layer, which steps constitute one cycle of the process. For example, the formation of the isolation dielectric layer 14L may include performing several such cycles of such a process. Therefore, neither the silicon atomic layer nor the oxygen atomic layer may be favorably deposited on the entrance and outer sides of the deep trench 22. Accordingly, as shown in FIG. 8B, the isolation dielectric layer 14L may be formed to have the first thickness T1 at the inside of the deep trench 22 and the second thickness T2, which is less than the first thickness T1, at the outside of the deep trench 22.

Figure 8C:
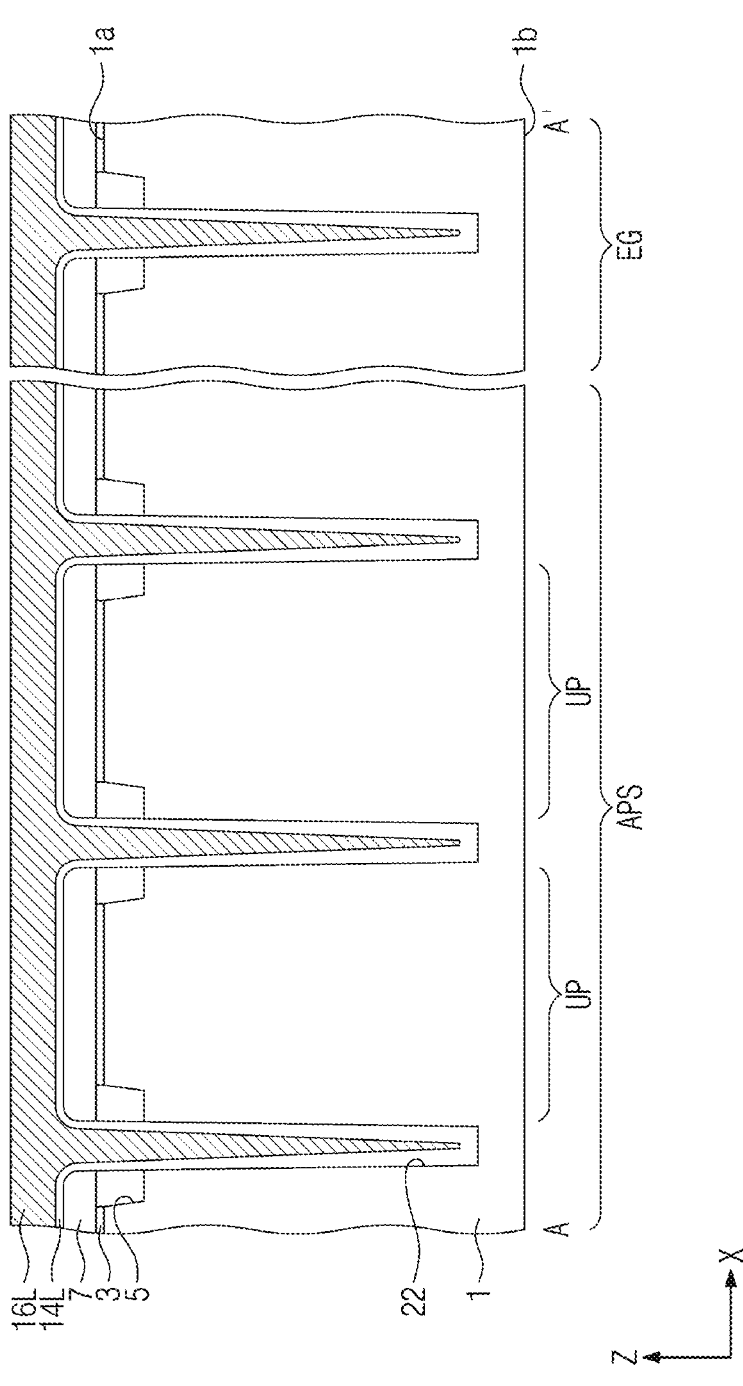

Referring to FIG. 8C, a conductive layer 16L may be formed on the isolation dielectric layer 14L to fill the deep trench 22 (e.g., fill a remainder region of the deep trench 22 that is not occupied by the isolation dielectric layer 14L). The conductive layer 16L may be formed of, for example, an impurity-doped polysilicon layer. The impurity may be, for example, boron, phosphorus, or arsenic. The conductive layer 16L may be formed by atomic layer deposition (ALD) or chemical vapor deposition (CVD). Because an increase in depth of the deep trench 22 induces an increase in thickness THX of the isolation dielectric layer 14L in the procedure of FIG. 8B, the deep trench 22 may have a small aspect ratio at an empty space which will be filled with the conductive layer 16L. Therefore, the deep trench 22 may be filled with the conductive layer 16L with no void within the deep trench 22. Accordingly, no process failure may occur when the conductive layer 16L is formed, or the likelihood of such process failure may be reduced or minimized, which may result in an increase in yield of manufactured image sensors that are at least partially manufactured according to the method shown in FIGS. 8A-8F lacking manufacturing defects, due to the improved strength and/or resistance to process failure/defects of the image sensor being manufactured based on the absence of voids within the deep trench 22, thereby improving the performance and efficiency of a manufacturing process to manufacture such image sensors.

Figure 8D:
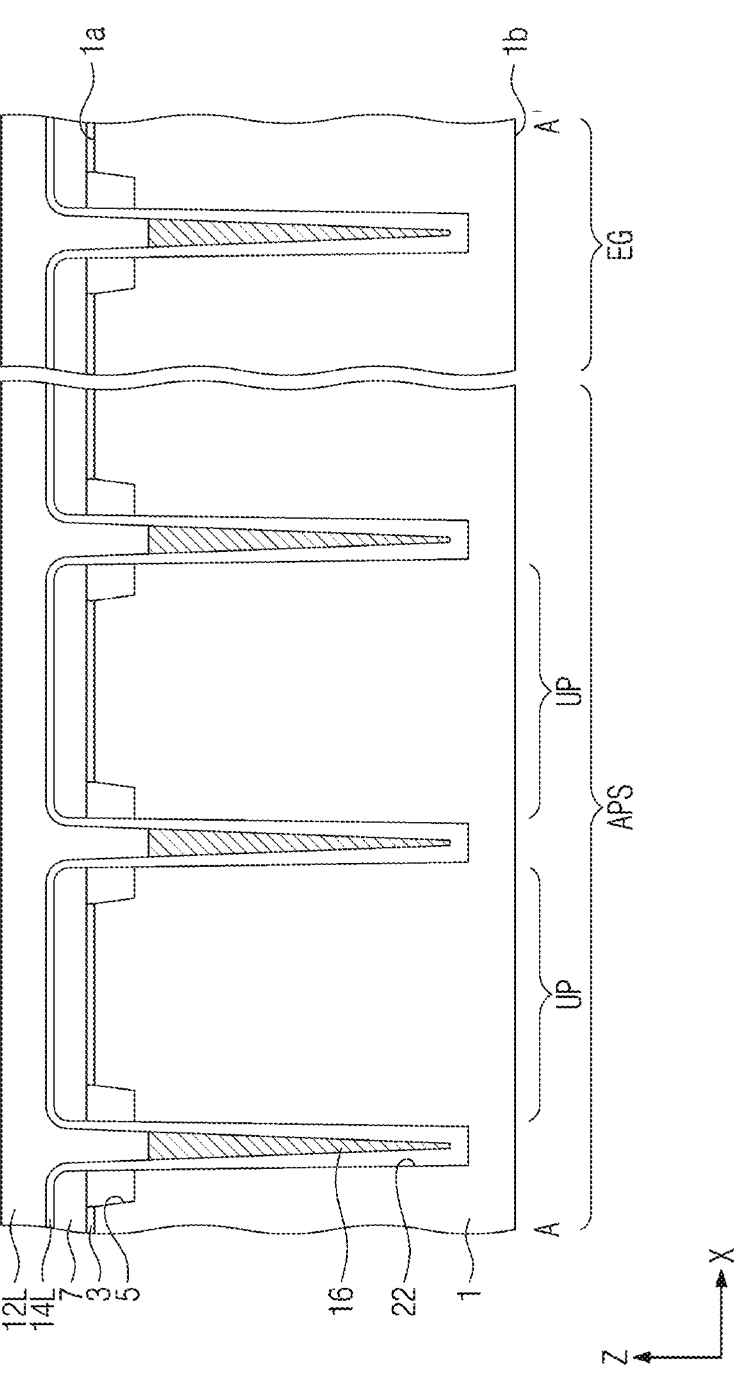

Referring to FIG. 8D, the conductive layer 16L may undergo an anisotropic etching process (e.g., based on chemical and/or laser etching of the conductive layer 16L) to form a conductive pattern 16 in the deep trench 22 and to expose a surface of the isolation dielectric layer 14L on the entrance and outer sides of the deep trench 22. A buried dielectric layer 12L may be stacked on the isolation dielectric layer 14L to fill an entrance of the deep trench 22. The buried dielectric layer 12L may have a single-layered or multi-layered structure of, for example, at least one selected from silicon oxide, silicon nitride, silicon oxynitride, and silicon carbonitride.

Figure 8E:
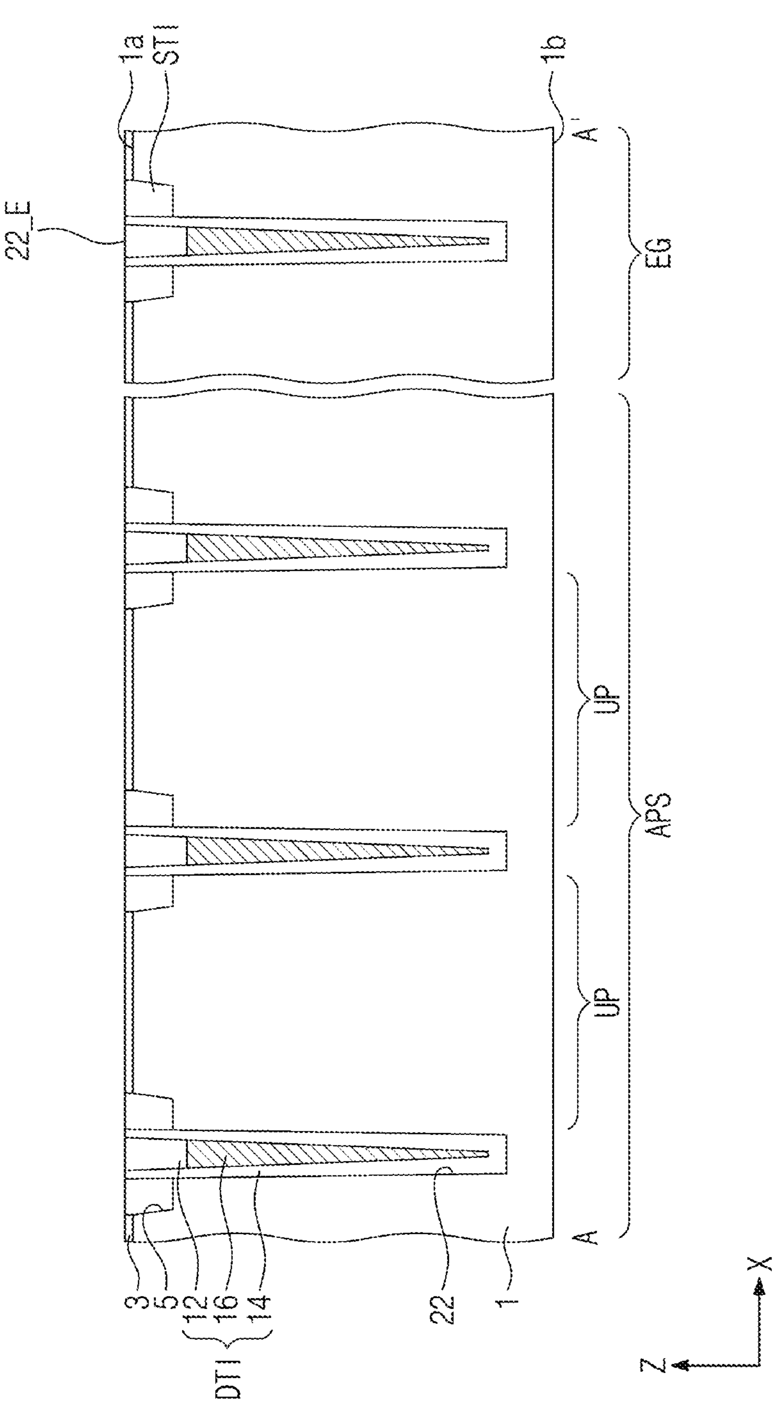

Referring to FIGS. 8D and 8E, a chemical mechanical polishing (CMP) process may be performed to remove the second mask pattern 7, the isolation dielectric layer 14L, and the buried dielectric layer 12L on the first mask pattern 3 and to expose a surface of the first mask pattern 3. In this step, a portion of the second mask pattern 7 may be formed into a device isolation part STI. In addition, a portion of the isolation dielectric layer 14L may be formed into an isolation dielectric pattern 14, and a portion of the buried dielectric layer 12L may be formed into a buried dielectric pattern 12. The buried dielectric pattern 12, the isolation dielectric pattern 14, and the conductive pattern 16 may constitute a pixel isolation part DTI. The pixel isolation part DTI may limit unit pixels UP. As shown, a thickness of a given portion of the isolation dielectric layer 14L may be variable so as to be proportional in thickness magnitude based on distance of the given portion from the entrance 22_E of the deep trench 22 at the front surface 1*a* of the first substrate 1 in the third direction Z.

Figure 8F:
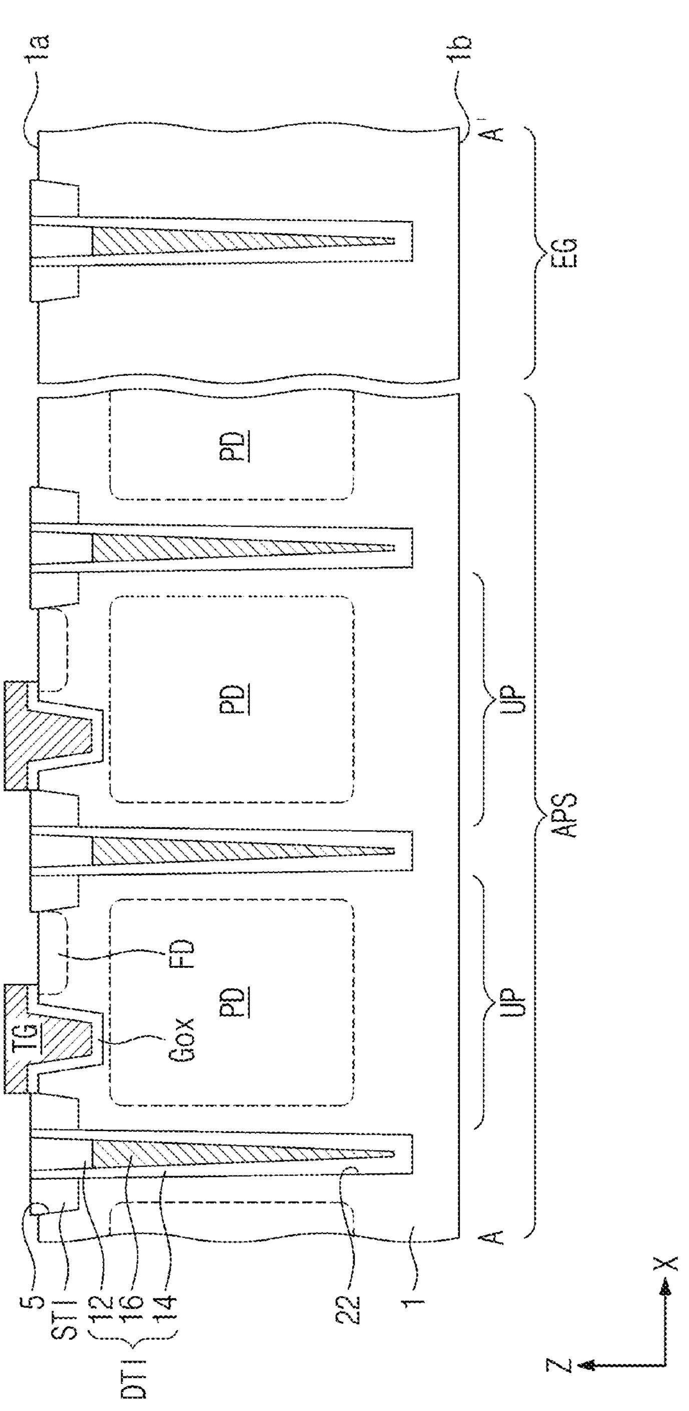

Referring to FIGS. 8E and 8F, the first mask pattern 3 may be removed to expose the front surface 1*a* of the first substrate 1. The first substrate 1 may undergo an ion implantation process to form a photoelectric conversion element PD. A transfer gate electrode TG, a gate dielectric layer Gox, and a floating diffusion region FD may be formed on the front surface 1*a* of the first substrate 1. Subsequently, ordinary processes may be performed to form other components discussed with reference to FIGS. 3 to 6C.

Figure 9:
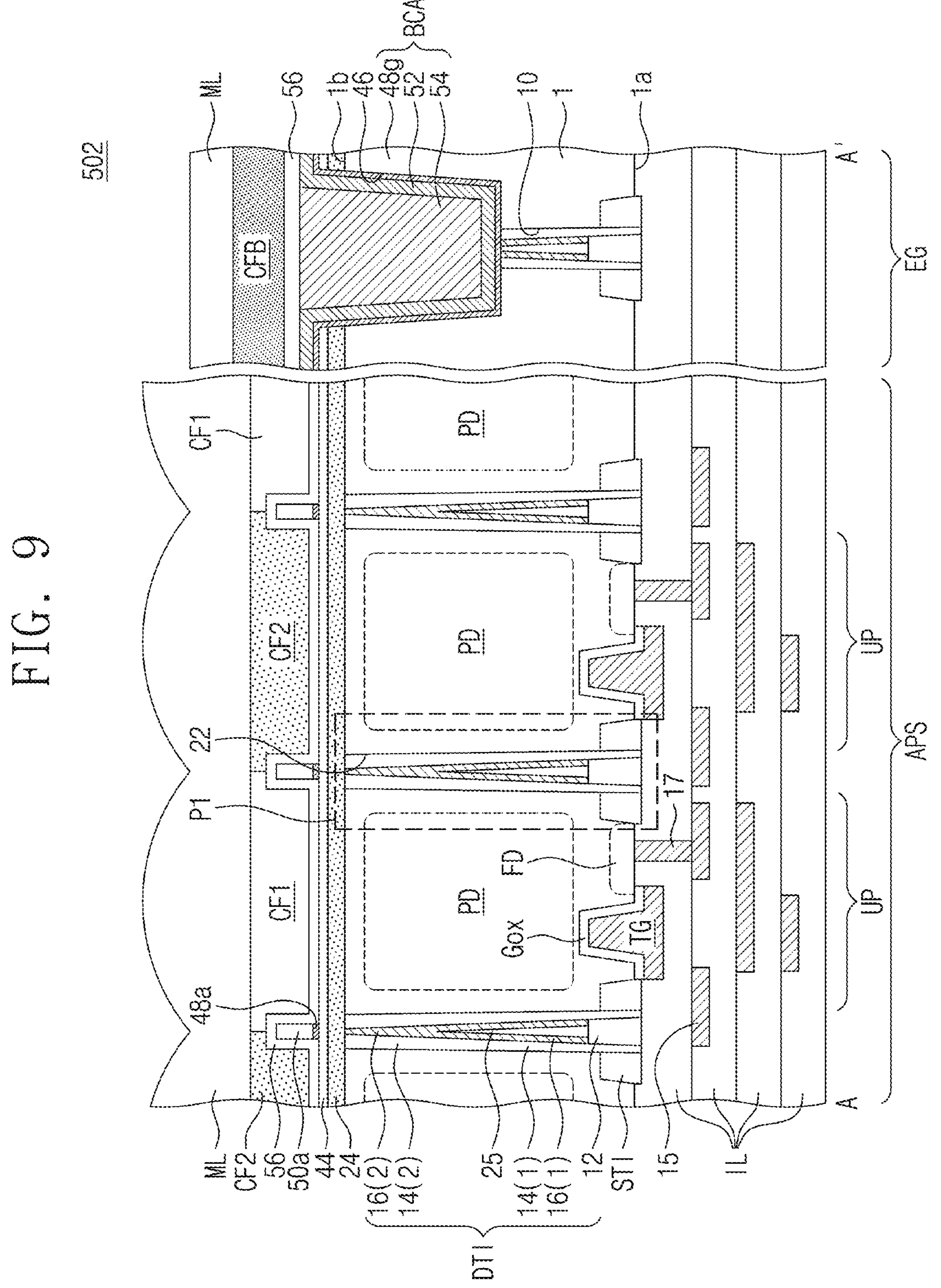
FIG. 9 illustrates a cross-sectional view taken along line A-A' of FIG. 3 or 4 according to some example embodiments of the present inventive concepts.
Figure 10A:
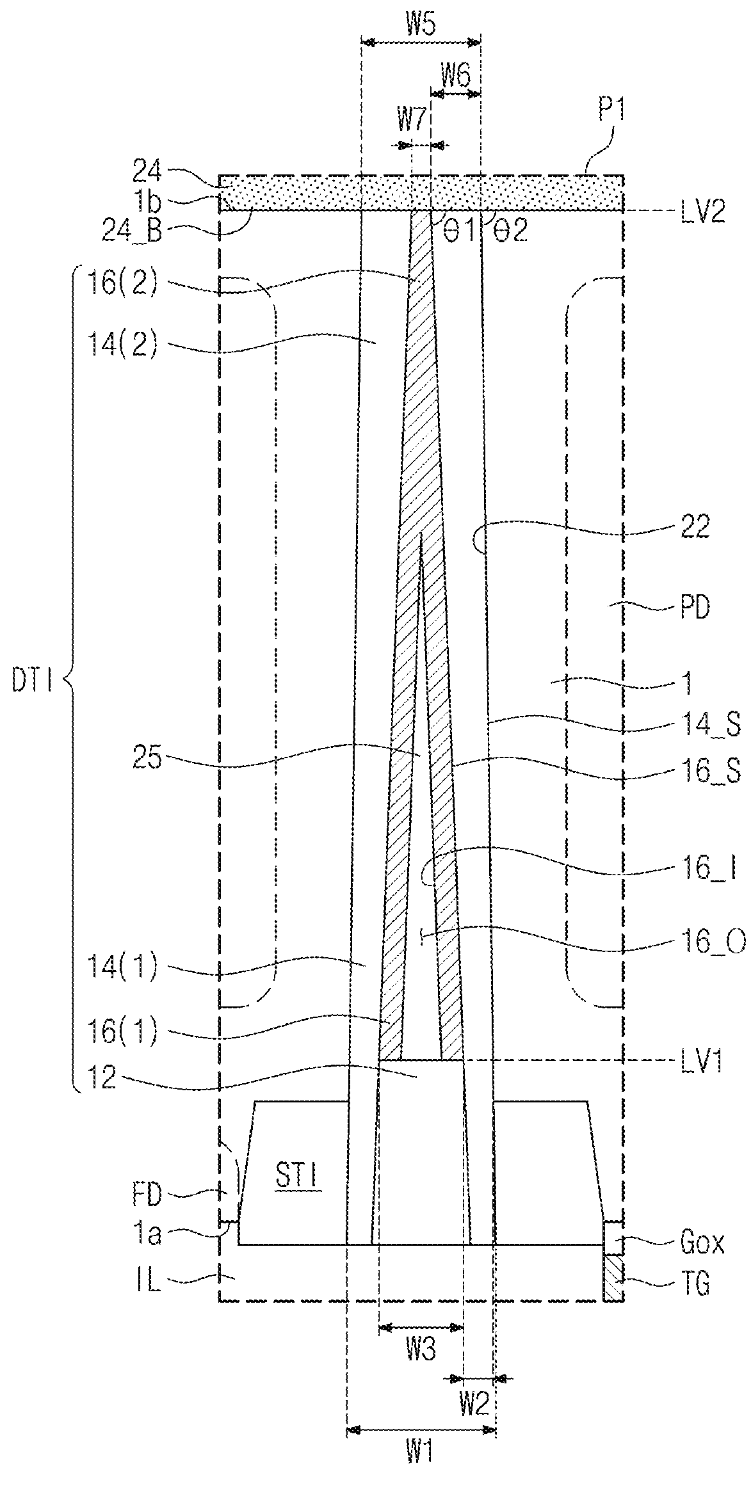
FIGS. 10A, 10B, and 10C illustrate enlarged views showing section P1 of FIG. 9 according to some example embodiments of the present inventive concepts.
Figure 10B:
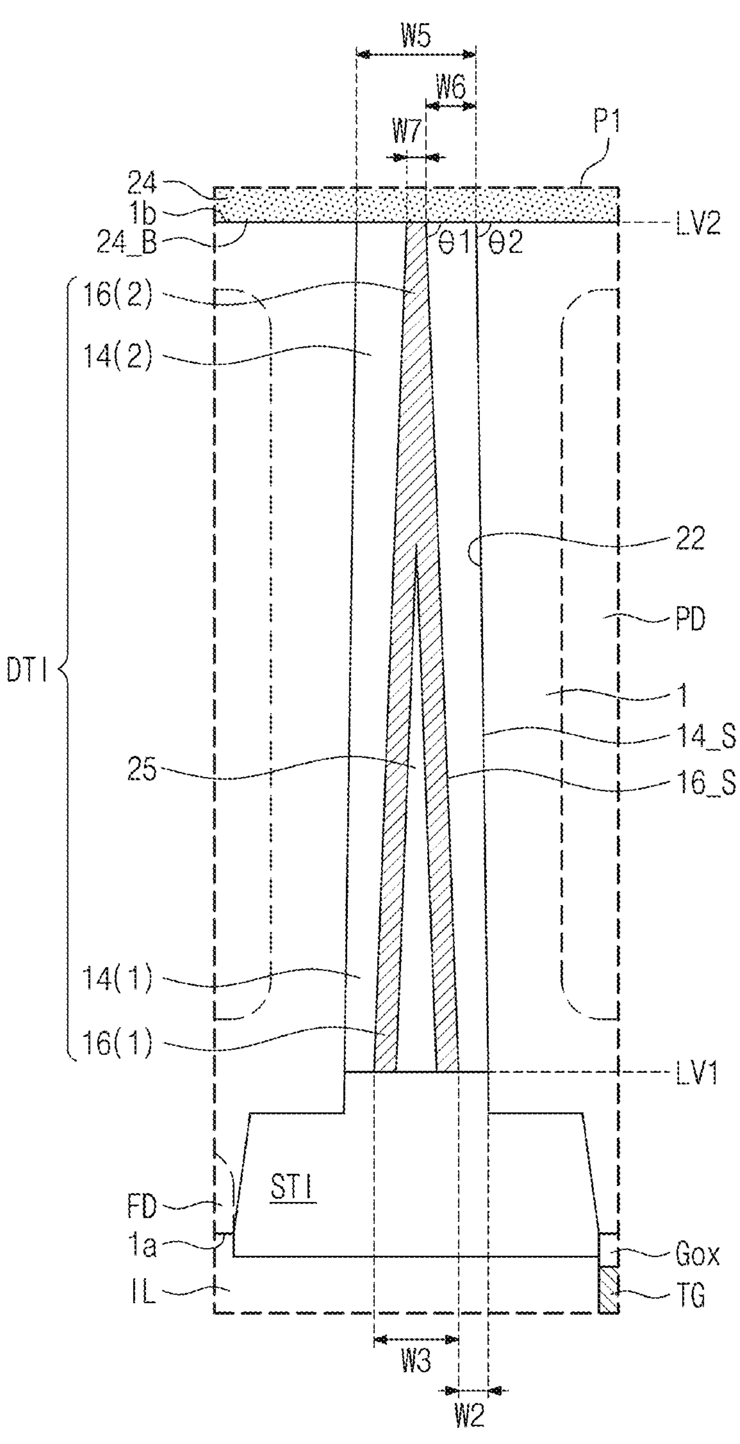
Figure 10C:
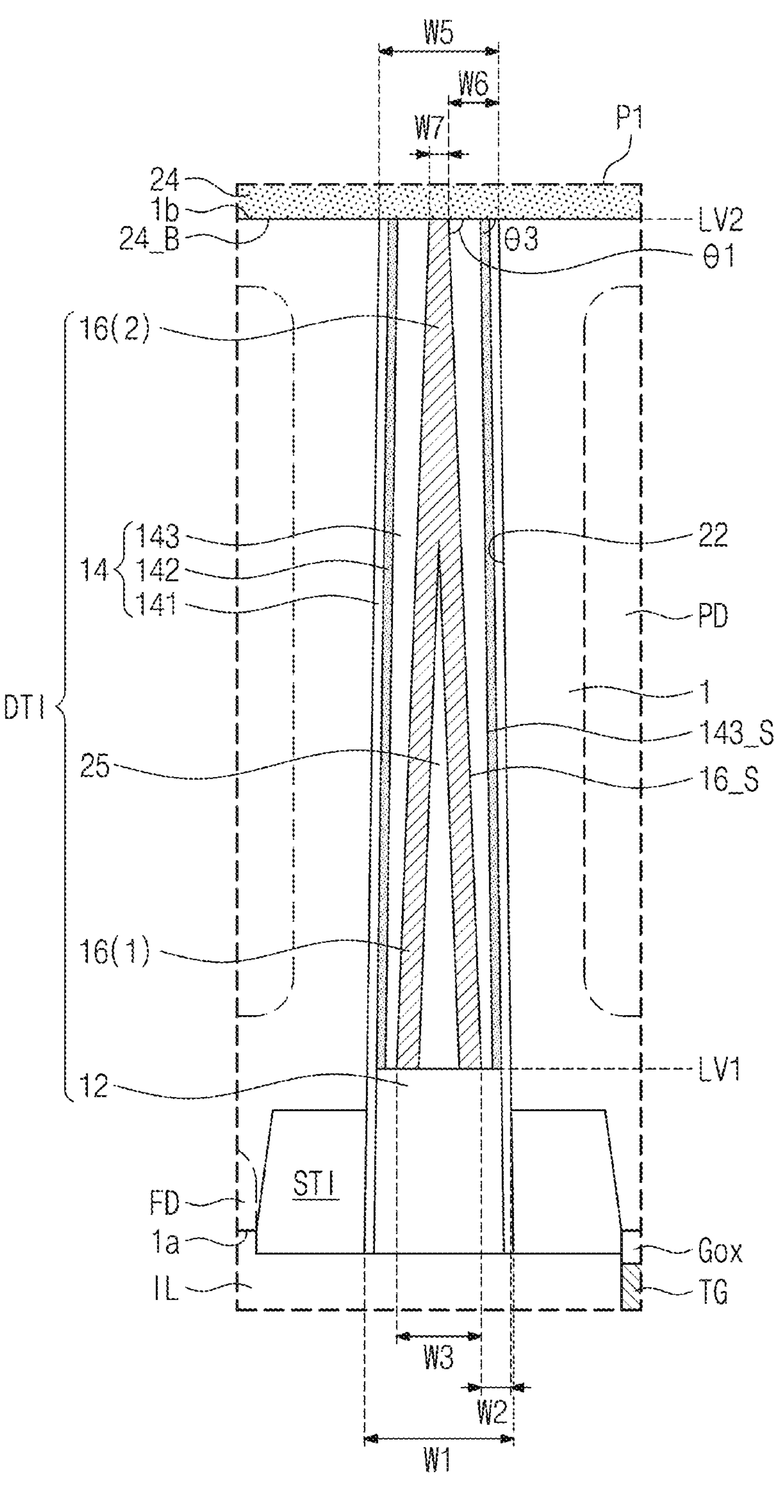

FIG. 9 illustrates a cross-sectional view taken along line A-A' of FIG. 3 or 4. FIGS. 10A, 10B, and 10C illustrate enlarged views showing section P1 of FIG. 9.

Referring to FIGS. 9 and 10A, an image sensor 502 according to some example embodiments may be configured such that the conductive pattern 16 of the pixel isolation part DTI has a hollow cup shape or a hollow shell shape having one or more inner surfaces 16_I at least partially defining an inner region 16_O (which may be an inner empty space) of the conductive pattern 16. The pixel isolation part DTI may further include an inner buried pattern 25 that fills the inner region 16_O (e.g., the inner empty space) of the conductive pattern 16. The inner buried pattern 25 may have a single-layered or multi-layered structure of at least one selected from silicon oxide, silicon nitride, silicon oxynitride, and silicon carbonitride. A bottom surface of the conductive pattern 16 may be coplanar with a bottom surface of the inner buried pattern 25. The conductive pattern 16 and the inner buried pattern 25 may be simultaneously in contact with the buried dielectric pattern 12 (e.g., the buried dielectric pattern 12 is in contact with both the conductive pattern 16 and the inner buried pattern 25). The inner buried pattern 25 may be spaced apart from (e.g., isolated from direct contact with) the fixed charge layer 24.

When the device isolation part STI, the isolation dielectric pattern 14, and the buried dielectric pattern 12 are formed of the same material (e.g., silicon oxide), as shown in FIG. 10B, no distinct interface may be provided between the device isolation part STI, the isolation dielectric pattern 14, and the buried dielectric pattern 12. For example, the device isolation part STI, the isolation dielectric pattern 14, and the buried dielectric pattern 12 may be separate portions of a single, unitary piece of material. For example, the device isolation part STI may appear to have a T shape.

The isolation dielectric pattern 14 may have a single-layered structure as shown in FIG. 10A. In some example embodiments, as shown in FIG. 10C, the isolation dielectric pattern 14 may include first, second, and third isolation dielectric patterns 141, 142, and 143 that are sequentially disposed in a direction (e.g., the first and/or second directions X and/or Y) from the first substrate 1 toward the conductive pattern 16. Other configurations may be identical or similar to those discussed with reference to FIGS. 3 to 6C.

Figure 11A:
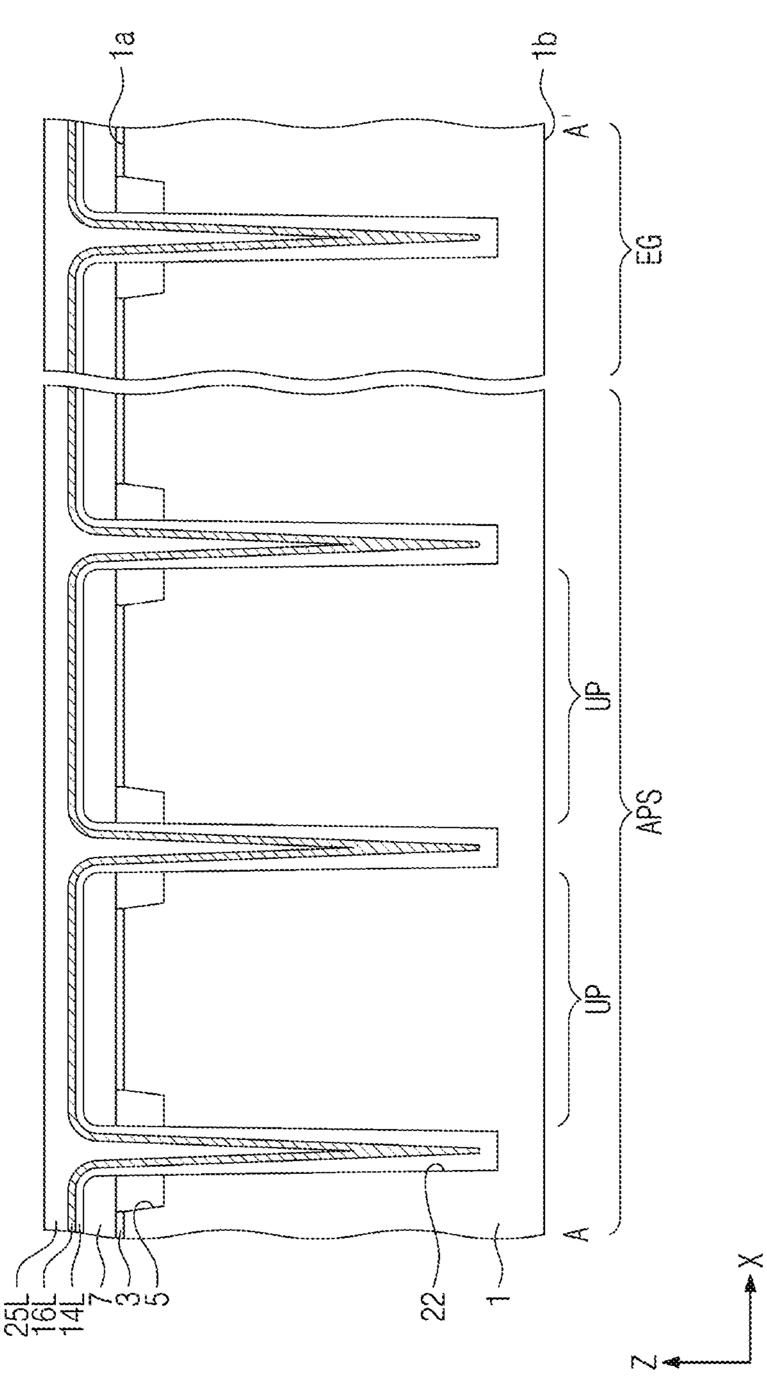
FIGS. 11A and 11B illustrate cross-sectional views showing a method of fabricating an image sensor having a cross-section of FIG. 9 according to some example embodiments of the present inventive concepts.
Figure 11B:
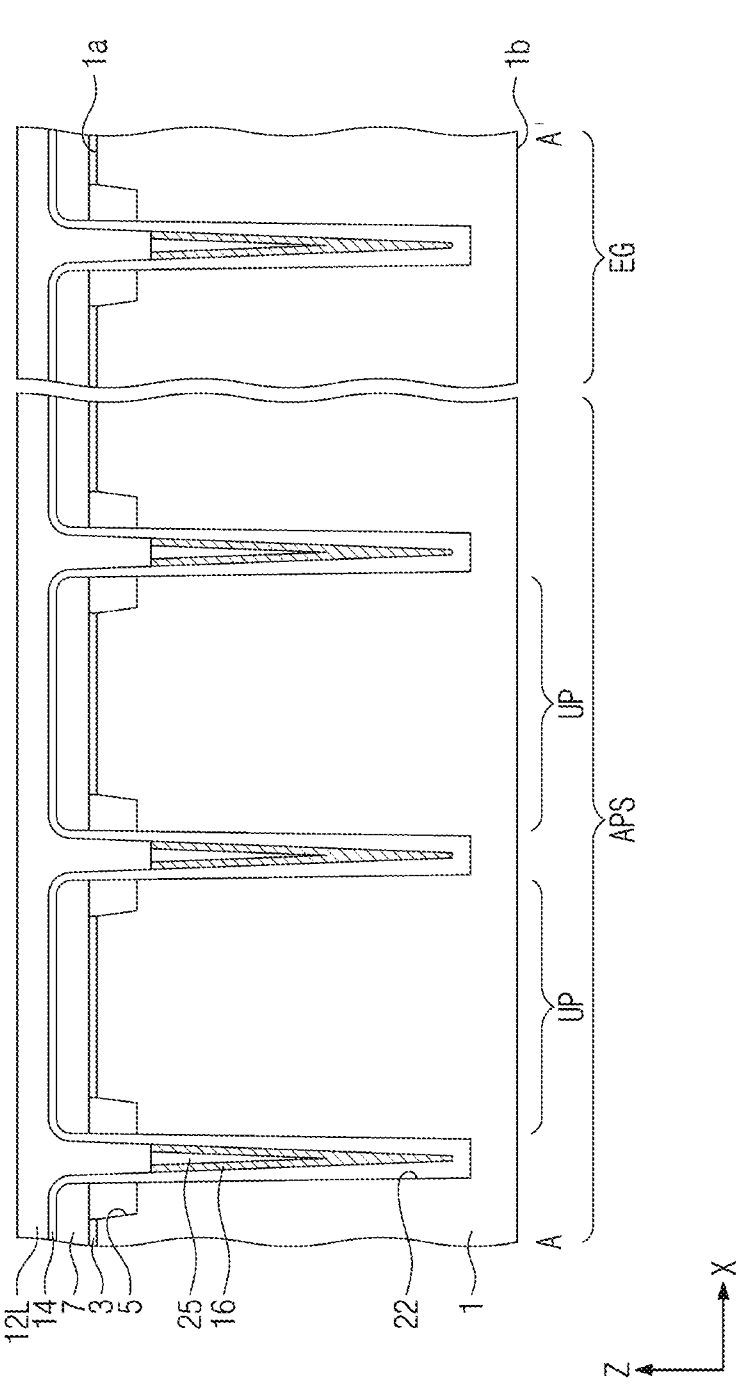

FIGS. 11A and 11B illustrate cross-sectional views showing a method of fabricating an image sensor having a cross-section of FIG. 9 according to some example embodiments of the present inventive concepts.

Referring to FIG. 11A, in the procedure of FIG. 8B, a conductive layer 16L may be conformally formed on the isolation dielectric layer 14L. The conductive layer 16L may not completely fill the deep trench 22. An inner buried layer 25L may be stacked on the conductive layer 16L to fill the deep trench 22.

Referring to FIG. 11B, the inner buried layer 25L and the conductive layer 16L may undergo an anisotropic etching process (e.g., based on chemical and/or laser etching of the inner buried layer 25L and the conductive layer 16L) to from a conductive pattern 16 and an inner buried pattern 25 in the deep trench 22 and to expose a surface of the isolation dielectric layer 14L on the entrance and outer sides of the deep trench 22. A buried dielectric layer 12L may be stacked on the isolation dielectric layer 14L to fill the entrance of the deep trench 22.

Subsequently, referring to FIG. 9, a chemical mechanical polishing (CMP) process may be performed to remove the second mask pattern 7, the isolation dielectric layer 14L, and the buried dielectric layer 12L on the first mask pattern 3 and to expose a surface of the first mask pattern 3. In this step, a portion of the second mask pattern 7 may be formed into a device isolation part STI. In addition, a portion of the isolation dielectric layer 14L may be formed into an isolation dielectric pattern 14. The buried dielectric pattern 12, the isolation dielectric pattern 14, the inner buried pattern 25, and the conductive pattern 16 may constitute a pixel isolation part DTI.

Figure 12:
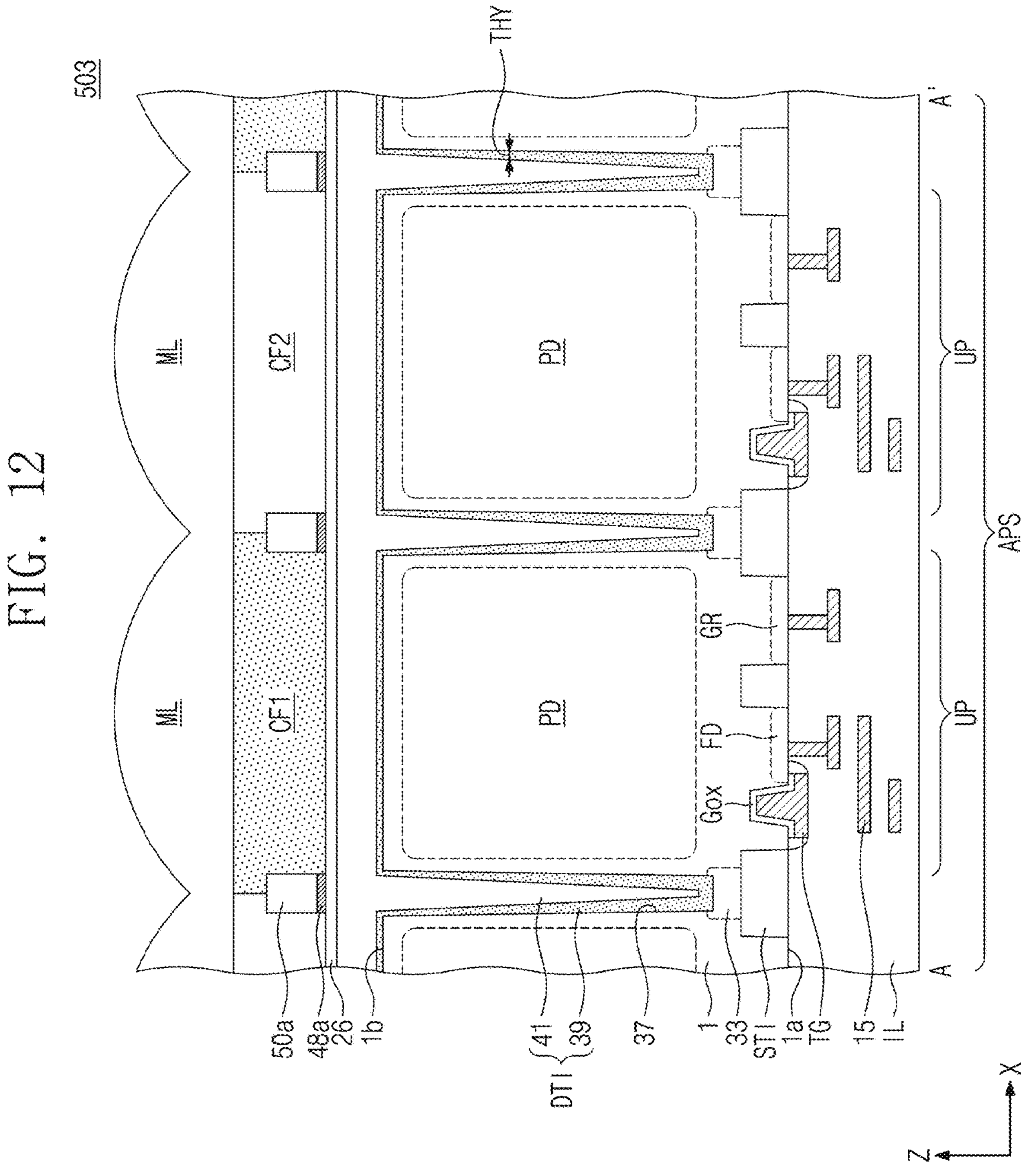
FIG. 12 illustrates a cross-sectional view showing an image sensor according to some example embodiments of the present inventive concepts.

FIG. 12 illustrates a cross-sectional view showing an image sensor according to some example embodiments of the present inventive concepts.

Referring to FIG. 12, an image sensor 503 according to some example embodiments may be configured such that a ground region GR is disposed adjacent to the front surface 1*a* of the first substrate 1. The device isolation part STI may be disposed between the ground region GR and the floating diffusion region FD. A deep trench 37 may be formed from the rear surface 1*b* toward the front surface 1*a* of the first substrate 1. A fixed charge layer 39 may cover the rear surface 1*b* of the first substrate 1 and may also cover an inner sidewall and a bottom surface of the deep trench 37. The fixed charge layer 39 may include metal oxide or metal fluoride. The metal oxide or metal fluoride may have a composition of atoms that do not satisfy a stoichiometric ratio. The fixed charge layer 39 may have a negative fixed charge. The fixed charge layer 39 may have a thickness THY that increases as coming closer to the front surface 1*a* or with increasing depth of the deep trench 37 (e.g., the thickness THY is proportional in magnitude to a distance of the thickness THY from the front surface 1*a* in the third direction Z). A planarization layer 41 may be disposed on the fixed charge layer 39. The planarization layer 41 may have a single-layered or multi-layered structure of at least one selected from silicon oxide, silicon nitride, silicon oxynitride, and silicon carbonitride. A portion of the planarization layer 41 may be inserted into the deep trench 37. The pixel isolation part DTI may be constituted by the fixed charge layer 39 and the planarization layer 41 that are disposed in the deep trench 37. An impurity region 33 may be disposed between the device isolation part STI and the bottom surface of the deep trench 37. The impurity region 33 may be doped with impurities whose conductivity type is the same as that of impurities doped in the first substrate 1, and a concentration of the impurities doped in the impurity region 33 may be greater than a concentration of the impurities doped in the first substrate 1. The impurity region 33 may serve as a pixel isolation part. A protection layer 26 may be disposed on the planarization layer 41. The protection layer 26 may be provided thereon with the light-shield pattern 48*a*, the low-refractive pattern 50*a*, the color filters CF1 and CF2, and the microlenses ML.

Figure 13:
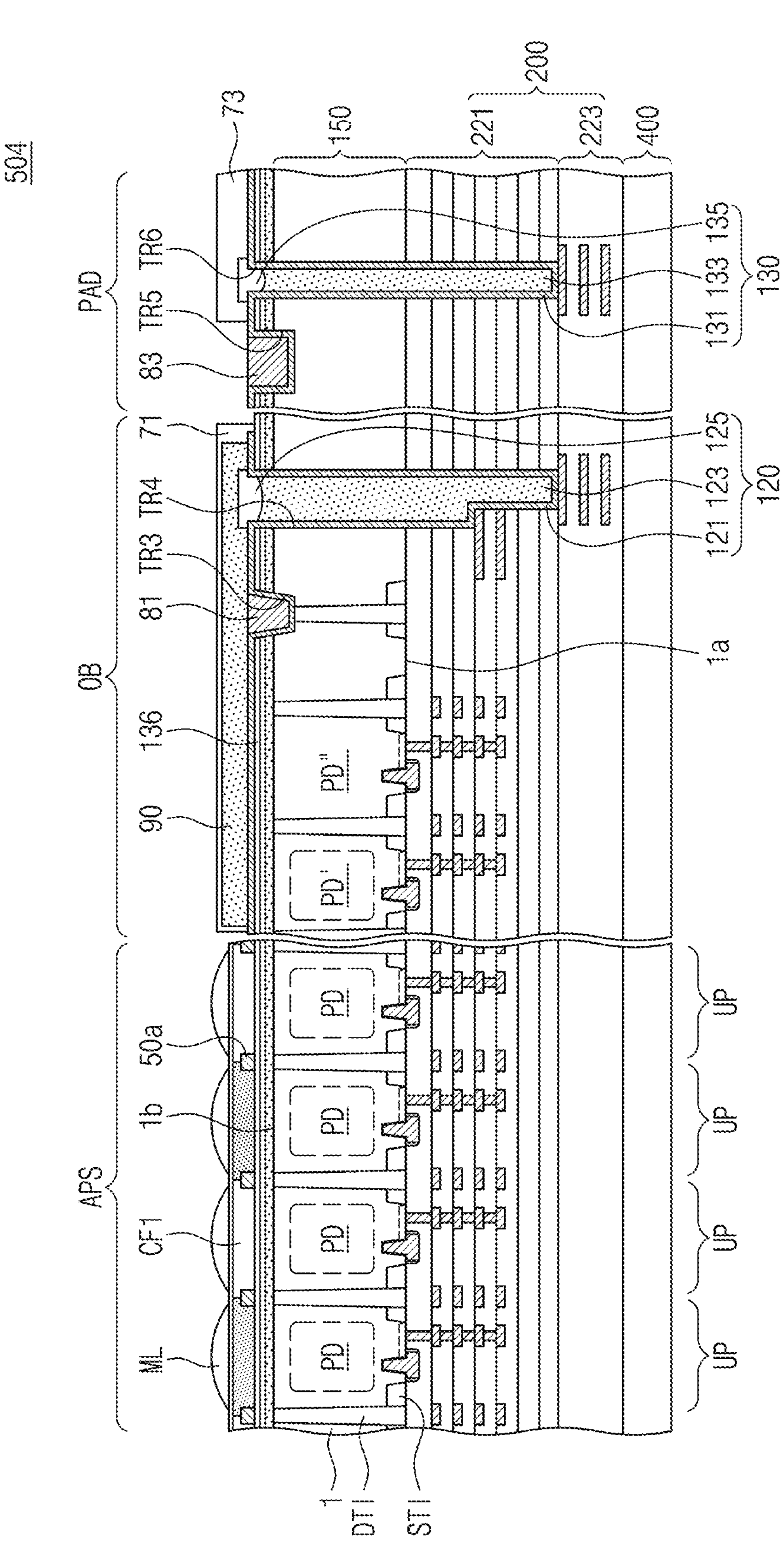
FIG. 13 illustrates a cross-sectional view showing an image sensor according to some example embodiments of the present inventive concepts.

FIG. 13 illustrates a cross-sectional view showing an image sensor according to some example embodiments of the present inventive concepts.

Referring to FIG. 13, an image sensor 504 according to some example embodiments of the present inventive concepts may include a first substrate 1 including a pixel array area APS, an optical black area OB, and a pad area PAD, and may also include a wiring layer 200 on a front surface 1*a* of the first substrate 1 and a second substrate 400 on the wiring layer 200. The wiring layer 200 may include an upper wiring layer 221 and a lower wiring layer 223. The pixel array area APS may include a plurality of unit pixels UP. The unit pixels UP disposed on the pixel array area APS may be substantially the same as those discussed above with reference to FIGS. 1 to 12.

On the optical black area OB, the first substrate 1 may be provided thereon with a first connection structure 120, a first conductive pad 81, and a bulk color filter 90. The first connection structure 120 may include a first light-shield pattern 121, a dielectric pattern 123, and a first capping pattern 125.

The first light-shield pattern 121 may be provided on a rear surface 1*b* of the first substrate 1. For example, the first light-shield pattern 121 may conformally cover inner walls of third and fourth trenches TR3 and TR4, while covering a second dielectric layer 136 on the rear surface 1*b*. The first light-shield pattern 121 may penetrate a photoelectric conversion layer 150 and the upper wiring layer 221 to connect the photoelectric conversion layer 150 to the wiring layer 200. For example, the first light-shield pattern 121 may be in contact with wiring lines in the upper and lower wiring layers 221 and 223 and with the conductive pattern 16 of the pixel isolation part DTI in the photoelectric conversion layer 150. Therefore, the first connection structure 120 may be electrically connected to wiring lines in the wiring layer 200. The first light-shield pattern 121 may include a metallic material, for example, tungsten. The first light-shield pattern 121 may block incidence of light onto the optical black area OB.

A first conductive pad 81 may be provided in the third trench TR3 to fill an unoccupied portion of the third trench TR3. The first conductive pad 81 may include a metallic material, such as aluminum. The first conductive pad 81 may be connected to the conductive pattern 16 of FIG. 5. A negative bias voltage may be applied through the first conductive pad 81 to the conductive pattern 16. Therefore, it may be possible to reduce, minimize, or prevent white spot and/or dark current in the image sensor 504, thereby improving operational performance of the image sensor 504.

The dielectric pattern 123 may fill an unoccupied portion of the fourth trench TR4. The dielectric pattern 123 may completely or partially penetrate the photoelectric conversion layer 150 and the wiring layer 200. The first capping pattern 125 may be provided on a top surface of the dielectric pattern 123. The first capping pattern 125 may be provided on the dielectric pattern 123.

The bulk color filter 90 may cover the first conductive pad 81, the first light-shield pattern 121, and the first capping pattern 125. The bulk color filter 90 may cover the first conductive pad 81, the first light-shield pattern 121, and the first capping pattern 125. A first protection layer 71 may be provided on and cover the bulk color filter 90.

A photoelectric conversion element PD' and a dummy element DR may be provided on the optical black area OB of the first substrate 1. For example, the photoelectric conversion element PD' may be doped with impurities having the second conductivity type different from the first conductivity type. The second conductivity type may be, for example, an n-type. The pixel array area APS may include a plurality of unit pixels UP. The photoelectric conversion element PD' may have a similar structure to that of a photoelectric conversion element PD on the pixel array area APS, but may not execute the same operation (e.g., generation of electrical signals from received light) as that of the photoelectric conversion element PD. The dummy element DR may not be doped with impurities. The dummy element DR may generate signals that are used as information to remove subsequent process noise.

On the pad area PAD, the first substrate 1 may be provided thereon with a second connection structure 130, a second conductive pad 83, and a second protection layer 73. The second connection structure 130 may include a second light-shield pattern 131, a dielectric pattern 133, and a second capping pattern 135.

The second light-shield pattern 131 may be provided on the rear surface 1*b* of the first substrate 1. For example, the second light-shield pattern 131 may conformally cover inner walls of fifth and sixth trenches TR5 and TR6, while covering the second dielectric layer 136 on the rear surface 1*b*. The second light-shield pattern 131 may penetrate the photoelectric conversion layer 150 and the upper wiring layer 221 to connect the photoelectric conversion layer 150 to the wiring layer 200. For example, the second light-shield pattern 131 may be in contact with wiring lines in the lower wiring layer 223. Therefore, the second connection structure 130 may be electrically connected to wiring lines in the wiring layer 200. The second light-shield pattern 131 may include a metallic material, such as tungsten.

A second conductive pad 83 may be provided in the fifth trench TR5 to fill an unoccupied portion of the fifth trench TR5. The second conductive pad 83 may include a metallic material, such as aluminum. The second conductive pad 83 may serve as an electrical connection path through which an image sensor device is connected to an external apparatus. The dielectric pattern 133 may fill an unoccupied portion of the sixth trench TR6. The dielectric pattern 133 may completely or partially penetrate the photoelectric conversion layer 150 and the wiring layer 200. The second capping pattern 135 may be provided on the dielectric pattern 133. The second protection layer 73 may cover the second capping pattern 135 and a portion of the second light-shield pattern 131.

A current applied through the second conductive pad 83 may flow toward the conductive pattern 16 of the pixel isolation part DTI through the second light-shield pattern 131, wiring lines in the wiring layer 200, and the first light-shield pattern 121. The photoelectric conversion elements PD and PD' and the dummy element DR may generate electrical signals, and the electrical signals may be outwardly transmitted through wiring lines in the wiring layer 200, the second light-shield pattern 131, and the second conductive pad 83.

Figure 14:
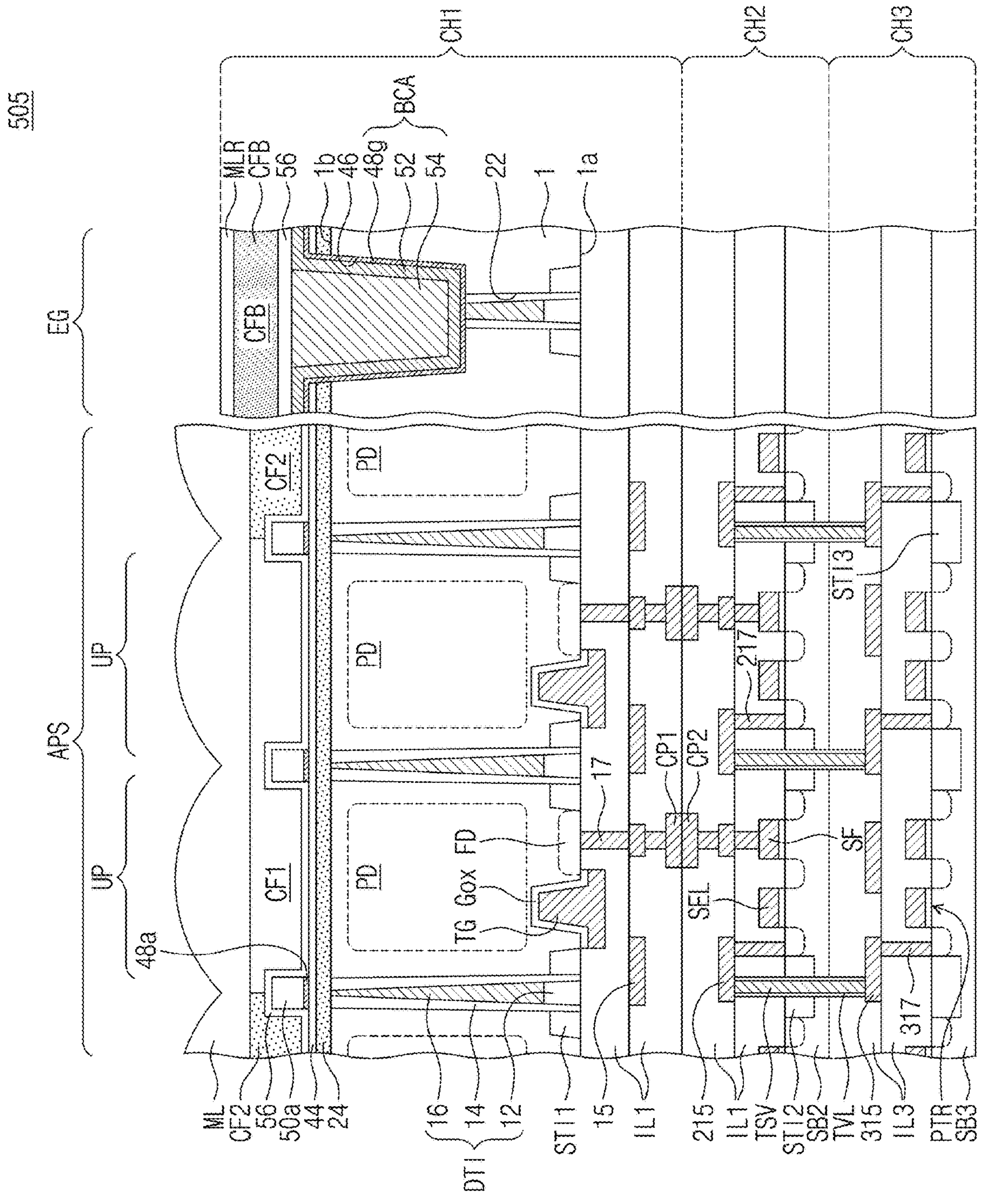
FIG. 14 illustrates a cross-sectional view showing an image sensor according to some example embodiments of the present inventive concepts.

FIG. 14 illustrates a cross-sectional view showing an image sensor according to some example embodiments of the present inventive concepts.

Referring to FIG. 14, an image sensor 505 according to some example embodiments may have a structure in which first to third sub-chips CH1 to CH3 are sequentially bonded. The first sub-chip CH1 may have, for example, an image sensing function. The first sub-chip CH1 may be the same as or similar to those discussed with reference to FIGS. 3 to 12. The first sub-chip CH1 may include transfer gate electrodes TG on the front surface 1*a* of the first substrate 1 and first interlayer dielectric layers IL1 that cover the transfer gate electrodes TG. The first substrate 1 may be provided therein a first device isolation part STI1 that defines active sections in the first substrate 1. A first conductive pad CP1 may be disposed in a lowermost first interlayer dielectric layer ILL The first conductive pad CP1 may include copper.

The second sub-chip CH2 may include a second substrate SB2, selection gate electrodes SEL, source follower gate electrodes SF, and reset gate electrodes (not shown) that are disposed on the second substrate SB2, and second interlayer dielectric layers IL2 that cover the selection gate electrodes SEL, the source follower gate electrodes SF, and the reset gate electrodes. The second substrate SB2 may be provided therein with a second device isolation part STI2 that defines active sections in the second substrate SB2. The second interlayer dielectric layers IL2 may be provided therein with second contacts 217 and second wiring lines 215. A second conductive pad CP2 may be disposed in an uppermost second interlayer dielectric layer IL2. The second conductive pad CP2 may include copper. The second conductive pad CP2 may be in contact with the first conductive pad CP1. The source follower gate electrodes SF may be correspondingly connected to the floating diffusion regions FD of the first sub-chip CH1.

The third sub-chip CH3 may include a third substrate SB3, peripheral transistors PTR disposed on the third substrate SB3, and third interlayer dielectric layers IL3 that cover the peripheral transistors PTR. The third substrate SB3 may be provided therein with a third device isolation part STI3 that define active sections in the third substrate SB3. The third interlayer dielectric layers IL3 may be provided therein with third contacts 317 and third wiring lines 315. An uppermost third interlayer dielectric layer IL3 may be in contact with the second substrate SB2. A through electrode TSV may penetrate the second interlayer dielectric layer IL2, the second device isolation part STI2, the second substrate SB2, and the third interlayer dielectric layer IL3 to thereby connect one of the second wiring lines 215 to one of the third wiring lines 315. A sidewall of the through electrode TSV may be surrounded with a via dielectric layer TVL. The third sub-chip CH3 may include circuits either for driving one or both of the first sub-chip CH1 and the second sub-chip CH2 or for storing electrical signals generated from one or both of the first sub-chip CH1 and the second sub-chip CH2.

In an image sensor according to the present inventive concepts, a pixel isolation part may include an isolation dielectric pattern whose width increases as coming closer to a rear surface of a substrate, which may result in an increase in total reflection ratio and therefore improve the operational performance of the image sensor. Thus, the image sensor may reduce, minimize, or prevent crosstalk, improve photosensitivity, and achieve generation of sharper images with improved clarity and/or resolution, and therefore improve the operational performance of the image sensor. In addition, no void may be formed in a conductive pattern of the pixel isolation part, and thus a negative bias may be uniformly applied irrespective of position, with the result that the occurrence of dark current may be suppressed. Moreover, backside strength of a product module may be increased to increase a final yield of image sensors based on the improved backside strength thereof based on the absence of voids within the conductive pattern of the pixel isolation part.

In a method of fabricating an image sensor according to the present inventive concepts, an isolation dielectric layer in a deep trench may be formed to have a thickness that decreases as coming closer to an entrance side of the deep trench, and the deep trench may then have a reduced aspect ratio at an empty space therein. Accordingly, when the empty space of the deep trench is filled with a conductive layer, any void may not be formed and process failure may be reduced, minimized, or prevented. As a result, a yield may increase.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts. Features of image sensors according to various example embodiments, including the example embodiments of FIGS. 3 to 14, may be combined with each other in one or more image sensors.

What is claimed is:

1. An image sensor, comprising:

a substrate that has a first surface and a second surface opposite to the first surface;

a fixed charge layer in contact with the second surface;

an interlayer dielectric layer that covers the first surface;

a device isolation part adjacent to the first surface in the substrate, the device isolation part defining an active section in the substrate; and a pixel isolation part in the substrate, the pixel isolation part penetrating the device isolation part and separating pixels from each other, wherein the pixel isolation part includes a conductive pattern in the substrate and in contact with the fixed charge layer, a buried dielectric pattern between the conductive pattern and the interlayer dielectric layer, and an isolation dielectric pattern that surrounds sidewalls of the conductive pattern and the buried dielectric pattern and is simultaneously in contact with the fixed charge layer and the interlayer dielectric layer, wherein the isolation dielectric pattern has a first thickness at a level between the buried dielectric pattern and the conductive pattern, and wherein the isolation dielectric pattern has a second thickness at a level of a bottom surface of the fixed charge layer, the second thickness being different from the first thickness.

2. The image sensor of claim 1, further comprising a transfer gate on the first surface, wherein the second thickness is about 1.2 times to about 2 times the first thickness.

3. The image sensor of claim 1, wherein the conductive pattern has a first sidewall, the isolation dielectric pattern has a second sidewall, and a slope of the first sidewall is different from a slope of the second sidewall.

4. The image sensor of claim 1, wherein when viewed in plan, the conductive pattern has a network shape that surrounds each of the pixels, the conductive pattern has a first portion adjacent to the first surface and a second portion adjacent to the second surface, and the second portion of the conductive pattern has a convex segment and a concave segment between the pixels that are spaced apart from each other in a first direction, the first direction extending parallel to the second surface of the substrate.

5. The image sensor of claim 4, wherein the convex segment of the second portion of the conductive pattern is spaced apart from a center of one of the pixels in the first direction, and the concave segment of the second portion of the conductive pattern is adjacent to a corner of the one of the pixels.

6. The image sensor of claim 1, wherein the isolation dielectric pattern includes:

a first isolation dielectric pattern in contact with the substrate;

a second isolation dielectric pattern in contact with the conductive pattern; and a third isolation dielectric pattern between the first isolation dielectric pattern and the second isolation dielectric pattern, wherein a dielectric constant of the third isolation dielectric pattern is different from respective dielectric constants of the first and second isolation dielectric patterns.

7. The image sensor of claim 6, wherein the second isolation dielectric pattern has a third thickness adjacent to the first surface and a fourth thickness adjacent to the second surface, the fourth thickness being different from the third thickness.

8. The image sensor of claim 1, wherein the conductive pattern has a hollow shell shape, and the pixel isolation part further includes a dielectric pattern that fills an inner region of the conductive pattern.

9. An image sensor, comprising:

a substrate that has a first surface and a second surface opposite to the first surface;

a fixed charge layer in contact with the second surface;

an interlayer dielectric layer that covers the first surface;

a device isolation part adjacent to the first surface in the substrate, the device isolation part defining an active section in the substrate; and a pixel isolation part in the substrate, the pixel isolation part penetrating the device isolation part and separating pixels from each other, wherein the pixel isolation part includes a conductive pattern in the substrate and in contact with the fixed charge layer, a buried dielectric pattern between the conductive pattern and the interlayer dielectric layer, and an isolation dielectric pattern that surrounds sidewalls of the conductive pattern and the buried dielectric pattern and is simultaneously in contact with the fixed charge layer and the interlayer dielectric layer, wherein the conductive pattern has a first sidewall, wherein the isolation dielectric pattern has a second sidewall, and wherein a slope of the first sidewall relative to a bottom surface of the fixed charge layer is different from a slope of the second sidewall relative to the bottom surface of the fixed charge layer.

10. The image sensor of claim 9, wherein the slope of the second sidewall is greater than the slope of the first sidewall.

11. The image sensor of claim 9, wherein the isolation dielectric pattern has a first thickness at a level between the buried dielectric pattern and the conductive pattern, and the isolation dielectric pattern has a second thickness at a level of the bottom surface of the fixed charge layer, the second thickness being different from the first thickness.

12. The image sensor of claim 11, further comprising a transfer gate on the first surface, wherein the second thickness is about 1.2 times to about 2 times the first thickness.

13. The image sensor of claim 9, wherein when viewed in plan, the conductive pattern has a network shape that surrounds each of the pixels, the conductive pattern has a first portion adjacent to the first surface and a second portion adjacent to the second surface, and the second portion of the conductive pattern has a convex segment and a concave segment between the pixels that are spaced apart from each other in a first direction.

14. The image sensor of claim 13, wherein the convex segment of the second portion of the conductive pattern is spaced apart from a center of one of the pixels in the first direction, and the concave segment of the second portion of the conductive pattern is adjacent to a corner of the one of the pixels.

15. The image sensor of claim 9, wherein the isolation dielectric pattern includes:

a first isolation dielectric pattern in contact with the substrate;

a second isolation dielectric pattern in contact with the conductive pattern; and a third isolation dielectric pattern between the first isolation dielectric pattern and the second isolation dielectric pattern, wherein a dielectric constant of the third isolation dielectric pattern is different from respective dielectric constants of the first and second isolation dielectric patterns.

16. The image sensor of claim 15, wherein the conductive pattern has a hollow shell shape, and the pixel isolation part further includes a dielectric pattern that fills an inner region of the conductive pattern.

17. An image sensor, comprising:

a substrate that has a first surface and a second surface opposite to the first surface, the substrate including first to fourth pixels that are disposed along a clockwise direction;

a fixed charge layer in contact with the second surface;

a transfer gate on the first surface of the substrate on each of the first to fourth pixels;

an interlayer dielectric layer that covers the first surface of the substrate; and a pixel isolation part in the substrate and between the first to fourth pixels, the pixel isolation part separating the first to fourth pixels from each other, wherein the pixel isolation part includes a conductive pattern in the substrate and in contact with the fixed charge layer, a buried dielectric pattern between the conductive pattern and the interlayer dielectric layer, and an isolation dielectric pattern that surrounds sidewalls of the conductive pattern and the buried dielectric pattern and is simultaneously in contact with the fixed charge layer and the interlayer dielectric layer, wherein the isolation dielectric pattern has a first thickness at a level between the buried dielectric pattern and the conductive pattern, wherein the isolation dielectric pattern has a second thickness at a level of a bottom surface of the fixed charge layer, and wherein the second thickness is about 1.2 times to about 2 times the first thickness.

18. The image sensor of claim 17, wherein the conductive pattern has a first sidewall, the isolation dielectric pattern has a second sidewall, and a slope of the first sidewall relative to the bottom surface of the fixed charge layer is less than a slope of the second sidewall relative to the bottom surface of the fixed charge layer.

19. The image sensor of claim 17, wherein when viewed in plan, the conductive pattern has a network shape that surrounds each of the first to fourth pixels, the conductive pattern has a first portion adjacent to the first surface and a second portion adjacent to the second surface, and the second portion of the conductive pattern has a convex segment and a concave segment between ones of the first to fourth pixels, the ones of the first to fourth pixels being spaced apart from each other in a first direction.

20. The image sensor of claim 19, wherein the convex segment of the second portion of the conductive pattern is spaced apart from a center of one of the first to fourth pixels in the first direction, and the concave segment of the second portion of the conductive pattern is adjacent to a corner of the one of the first to fourth pixels.

* * * * *